US012575089B2

(12) United States Patent
Huang et al.

(10) Patent No.: US 12,575,089 B2
(45) Date of Patent: Mar. 10, 2026

(54) MEMORY DEVICE WITH TAPERED BIT LINE CONTACT

(71) Applicant: NANYA TECHNOLOGY CORPORATION, New Taipei City (TW)

(72) Inventors: Chih-Wei Huang, Taoyuan City (TW); Hsu-Cheng Fan, Taoyuan City (TW); Chih-Yu Yen, New Taipei City (TW)

(73) Assignee: NANYA TECHNOLOGY CORPORATION, New Taipei City (TW)

( * ) Notice: Subject to any disclaimer, the term of this patent is extended or adjusted under 35 U.S.C. 154(b) by 374 days.

(21) Appl. No.: 18/219,241

(22) Filed: Jul. 7, 2023

(65) Prior Publication Data

US 2025/0016995 A1 Jan. 9, 2025

(51) Int. Cl.
*H10B 12/00* (2023.01)

(52) U.S. Cl.
CPC ......... *H10B 12/488* (2023.02); *H10B 12/482* (2023.02); *H10B 12/485* (2023.02)

(58) Field of Classification Search
CPC .. H10B 12/315; H10B 12/482; H10B 12/488; H10B 12/485
See application file for complete search history.

(56) References Cited

U.S. PATENT DOCUMENTS

2004/0191930 A1* 9/2004 Son ................... H01L 21/31053
257/E21.244

2017/0104046 A1 4/2017 Seo et al.
2020/0020697 A1* 1/2020 Kim ................... H10B 12/0335
2021/0082922 A1* 3/2021 Huang ............... H01L 23/5283

FOREIGN PATENT DOCUMENTS

| TW | 201347147 A | 11/2013 |
| TW | 201545351 A | 12/2015 |
| TW | 201937593 A | 9/2019 |
| TW | 202111963 A | 3/2021 |
| TW | 202303849 A | 1/2023 |

OTHER PUBLICATIONS

Office Action and Search Report mailed on Aug. 28, 2024 related to Taiwanese Application No. 113108693.
Office Action and Search Report mailed on Jun. 4, 2024 related to Taiwanese Application No. 112126914.
Office Action and Search Report mailed on Feb. 15, 2024 related to Taiwanese Application No. 112126914.
Office Action and Search Report mailed on Apr. 3, 2024 related to Taiwanese Application No. 112126914.

* cited by examiner

*Primary Examiner* — Steven M Page
(74) *Attorney, Agent, or Firm* — Xuan Zhang

(57) ABSTRACT

A memory device includes a semiconductor substrate having an active region, and a word line extending across the active region. The memory device also includes a first source/drain region and a second source/drain region disposed in the active region and on opposite sides of the word line. The memory device further includes a bit line contact disposed over and electrically connected to the first source/drain region. The bit line contact has a tapered profile. In addition, the memory device includes a capacitor contact disposed over and electrically connected to the second source/drain region.

15 Claims, 21 Drawing Sheets

Figure 3:
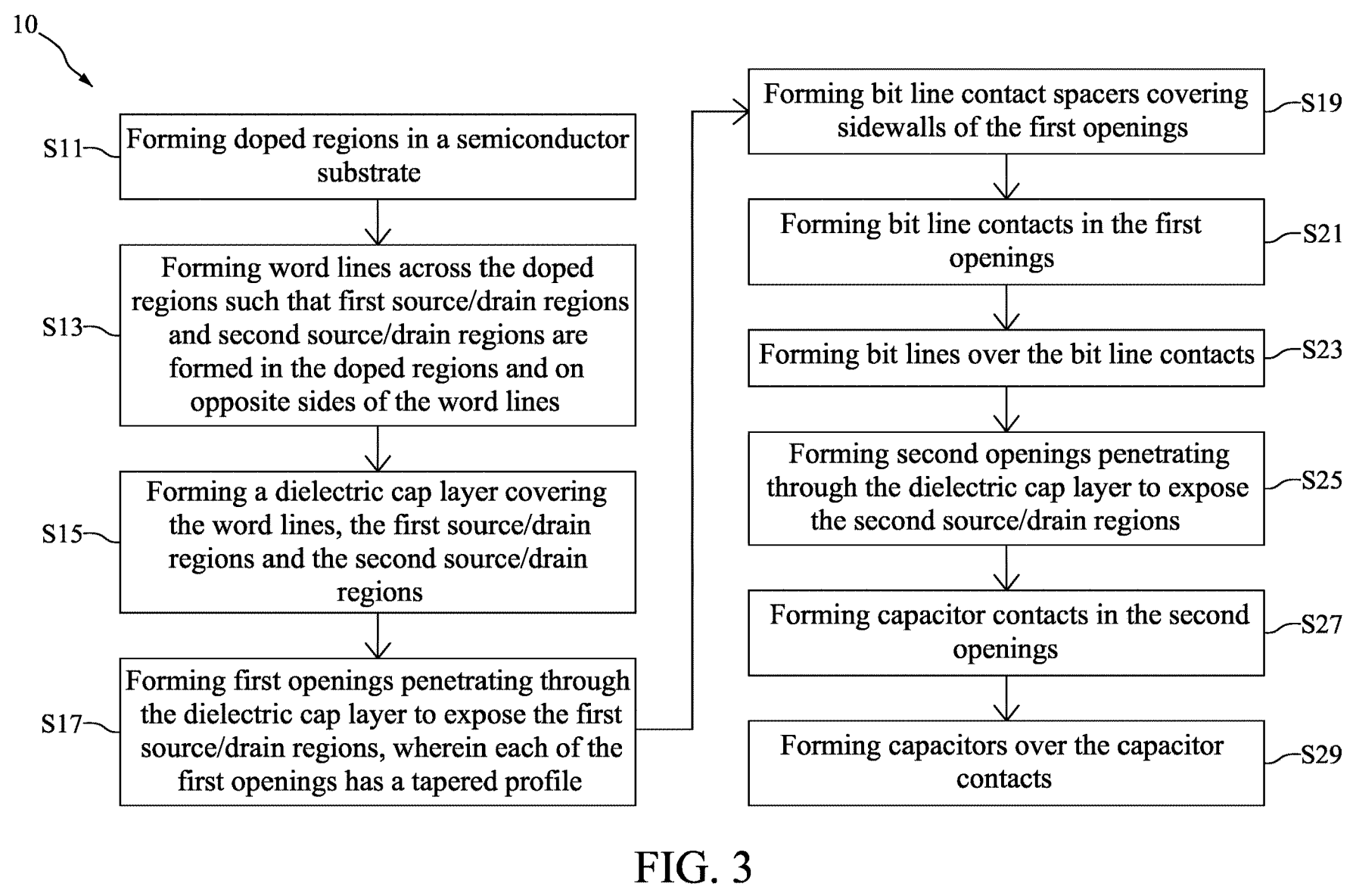

S19 — Forming bit line contact spacers covering sidewalls of the first openings

S21 — Forming bit line contacts in the first openings

S23 — Forming bit lines over the bit line contacts

S25 — Forming second openings penetrating through the dielectric cap layer to expose the second source/drain regions S27 — Forming capacitor contacts in the second openings S29 — Forming capacitors over the capacitor contacts S11 — Forming doped regions in a semiconductor substrate S13 — Forming word lines across the doped regions such that first source/drain regions and second source/drain regions are formed in the doped regions and on opposite sides of the word lines S15 — Forming a dielectric cap layer covering the word lines, the first source/drain regions and the second source/drain regions S17 — Forming first openings penetrating through the dielectric cap layer to expose the first source/drain regions, wherein each of the first openings has a tapered profile

MEMORY DEVICE WITH TAPERED BIT LINE CONTACT

TECHNICAL FIELD

The present disclosure relates to a memory device and a method for preparing the same, and more particularly, to a memory device with a tapered bit line contact and a method for preparing the same.

DISCUSSION OF THE BACKGROUND

Due to structural simplicity, dynamic random access memories (DRAMs) can provide more memory cells per unit chip area than other types of memories, such as static random access memories (SRAMs). A DRAM is constituted by a plurality of DRAM cells, each of which includes a capacitor for storing information and a transistor coupled to the capacitor for regulating when the capacitor is charged or discharged. During a read operation, a word line (WL) is asserted, turning on the transistor. The enabled transistor allows the voltage across the capacitor to be read by a sense amplifier through a bit line (BL). During a write operation, the data to be written is provided on the BL while the WL is asserted.

To satisfy the demand for greater memory storage, the dimensions of the DRAM memory cells have continuously shrunk so that the packing densities of these DRAMs have increased considerably. However, the manufacturing and integration of memory devices involve many complicated steps and operations. Integration in memory devices becomes increasingly complicated. An increase in complexity of manufacturing and integration of the memory device may cause deficiencies. Accordingly, there is a continuous need to improve the structure and the manufacturing process of memory devices so that the deficiencies can be addressed, and the performance can be enhanced.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

In one embodiment of the present disclosure, a memory device is provided. The memory device includes a semiconductor substrate having an active region, and a word line extending across the active region. The memory device also includes a first source/drain region and a second source/drain region disposed in the active region and on opposite sides of the word line. The memory device further includes a bit line contact disposed over and electrically connected to the first source/drain region. The bit line contact has a tapered profile. In addition, the memory device includes a capacitor contact disposed over and electrically connected to the second source/drain region.

In an embodiment, the memory device further includes a dielectric cap layer disposed over the semiconductor substrate, wherein the capacitor contact and the bit line contact penetrate through the dielectric cap layer. In addition, the memory device includes a bit line contact spacer disposed between the dielectric cap layer and the bit line contact. In an embodiment, the bit line contact spacer and the dielectric cap layer include different materials. In an embodiment, the memory device further includes a capacitor disposed over and electrically connected to the capacitor contact.

In an embodiment, the memory device further includes a bit line disposed over and electrically connected to the bit line contact. In an embodiment, the bit line contact is tapered from the bit line to the semiconductor substrate. In an embodiment, a top width of the bit line contact is substantially the same as a bottom width of the bit line. In an embodiment, the top width of the bit line contact is greater than a bottom width of the bit line contact.

In another embodiment of the present disclosure, a memory device is provided. The memory device includes a semiconductor substrate having an active region, and a word line extending across the active region. The memory device also includes a first source/drain region and a second source/drain region disposed in the active region and on opposite sides of the word line. The memory device further includes a dielectric cap layer covering the word line, and a bit line contact penetrating through the dielectric cap layer to contact the first source/drain region. A top width of the bit line contact is greater than a bottom width of the bit line contact. In addition, the memory device includes a capacitor contact penetrating through the dielectric cap layer to contact the second source/drain region.

In an embodiment, the bit line contact has a tapered profile along a direction from a top surface of the dielectric cap layer towards the first source/drain region. In an embodiment, a ratio of the top width to the bottom width of the bit line contact is in a range from about 1.45 to about 1.85. In an embodiment, an angle between a top surface and a sidewall of the bit line contact is in a range from about 73 degrees to about 81 degrees.

In an embodiment, the memory device further includes a bit line contact spacer separating the bit line contact from the dielectric cap layer. In an embodiment, the memory device further includes a capacitor disposed over the capacitor contact, and a bit line disposed over the bit line contact. In an embodiment, the memory device further includes a bit line spacer disposed on a sidewall of the bit line, wherein the bit line spacer is in direct contact with the bit line contact spacer.

In yet another embodiment of the present disclosure, a method for preparing a memory device is provided. The method includes forming a doped region in a semiconductor substrate, and forming a word line across the doped region such that a first source/drain region and a second source/drain region are formed in the doped region and on opposite sides of the word line. The method also includes forming a dielectric cap layer covering the word line, the first source/drain region and the second source/drain region, and forming a first opening penetrating through the dielectric cap layer to expose the first source/drain region. The first opening has a tapered profile along a direction from a top surface of the dielectric cap layer towards the first source/drain region. The method further includes forming a bit line contact in the first opening, and forming a second opening penetrating through the dielectric cap layer to expose the second source/drain region. In addition, the method includes forming a capacitor contact in the second opening.

In an embodiment, a top width of the first opening is greater than a bottom width of the first opening. In an embodiment, the word line includes a gate electrode and a gate dielectric layer surrounding the gate electrode, and the gate dielectric layer is exposed by the first opening. In an embodiment, the step of forming the first opening includes performing a first etching process on the dielectric cap layer using a first etchant gas including $CH_4/CHF_3$. In an embodiment, the step of forming the first opening includes performing a second etching process on the dielectric cap layer using a second etchant gas including $CH_4/CH_2F_2$ after the first etching process is performed.

In an embodiment, the method further includes depositing a spacer layer over the dielectric cap layer after the first opening is formed, and partially removing the spacer layer to expose the first source/drain region, thereby forming a bit line contact spacer covering a sidewall of the first opening. In an embodiment, a remaining portion of the first opening is filled by the bit line contact after the bit line contact spacer is formed. In an embodiment, the method further includes forming a bit line over the bit line contact, wherein the bit line contact is tapered from the bit line to the first source/ drain region. In an embodiment, the method further includes forming a bit line spacer covering a sidewall of the bit line. In an embodiment, the method further includes forming a dielectric layer over the dielectric cap layer, wherein the bit line and the bit line spacer are covered by the dielectric layer. In addition, the method includes forming the second opening penetrating through the dielectric layer and the dielectric cap layer to expose the second source/drain region.

Embodiments of a memory device and method for preparing the same are provided in the disclosure. In some embodiments, the memory device includes a bit line contact having a tapered profile. Therefore, overlay or alignment failure issues may be reduced, and leakage current between source/drain regions may be avoided. As a result, the overall device performance may be improved, and the yield rate of the memory device may be increased.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIG. 3 is a flow diagram illustrating a method for preparing a memory device, in accordance with some embodiments.

DETAILED DESCRIPTION

Figure 1:
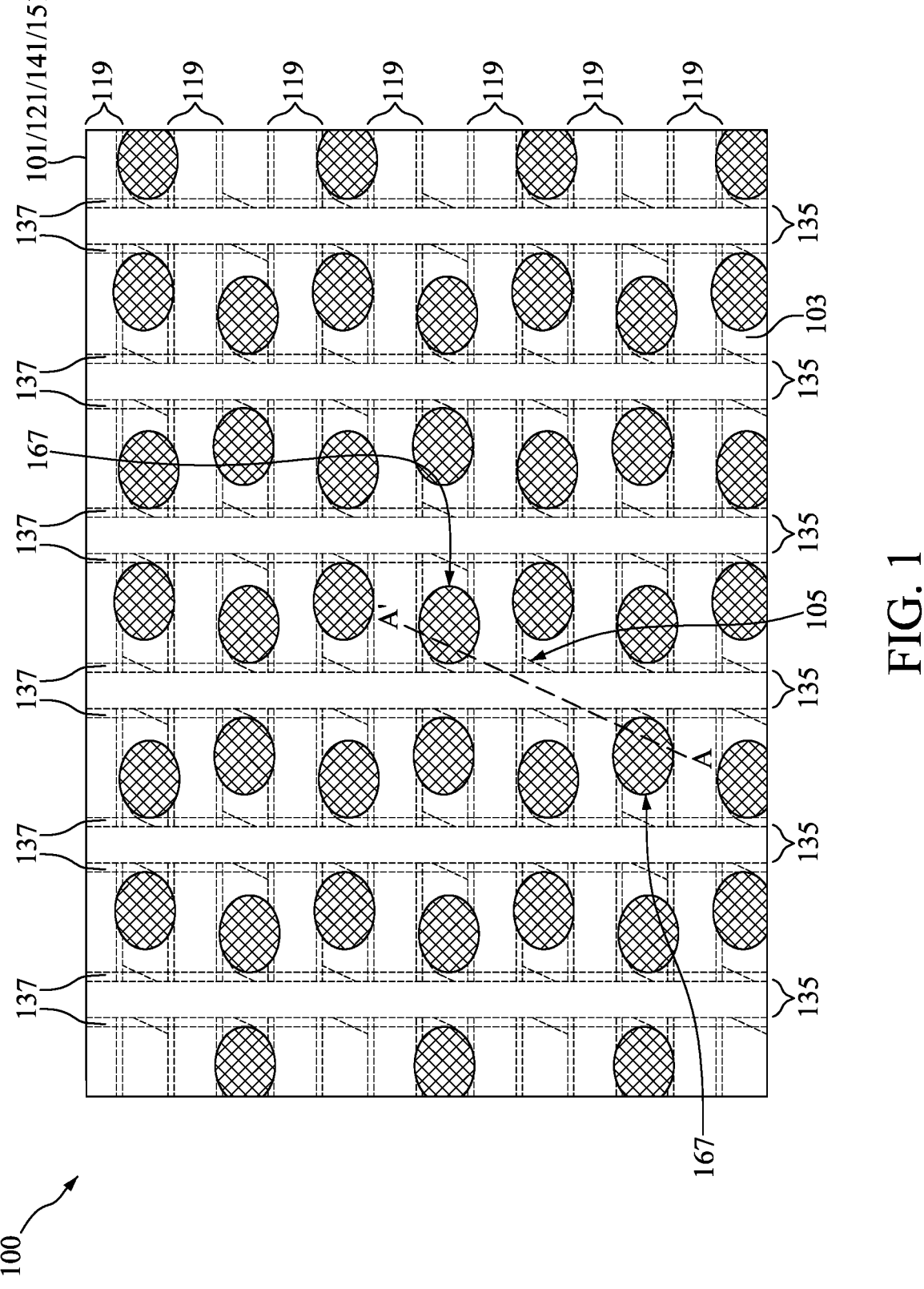
FIG. 1 is a top view illustrating a memory device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 2:
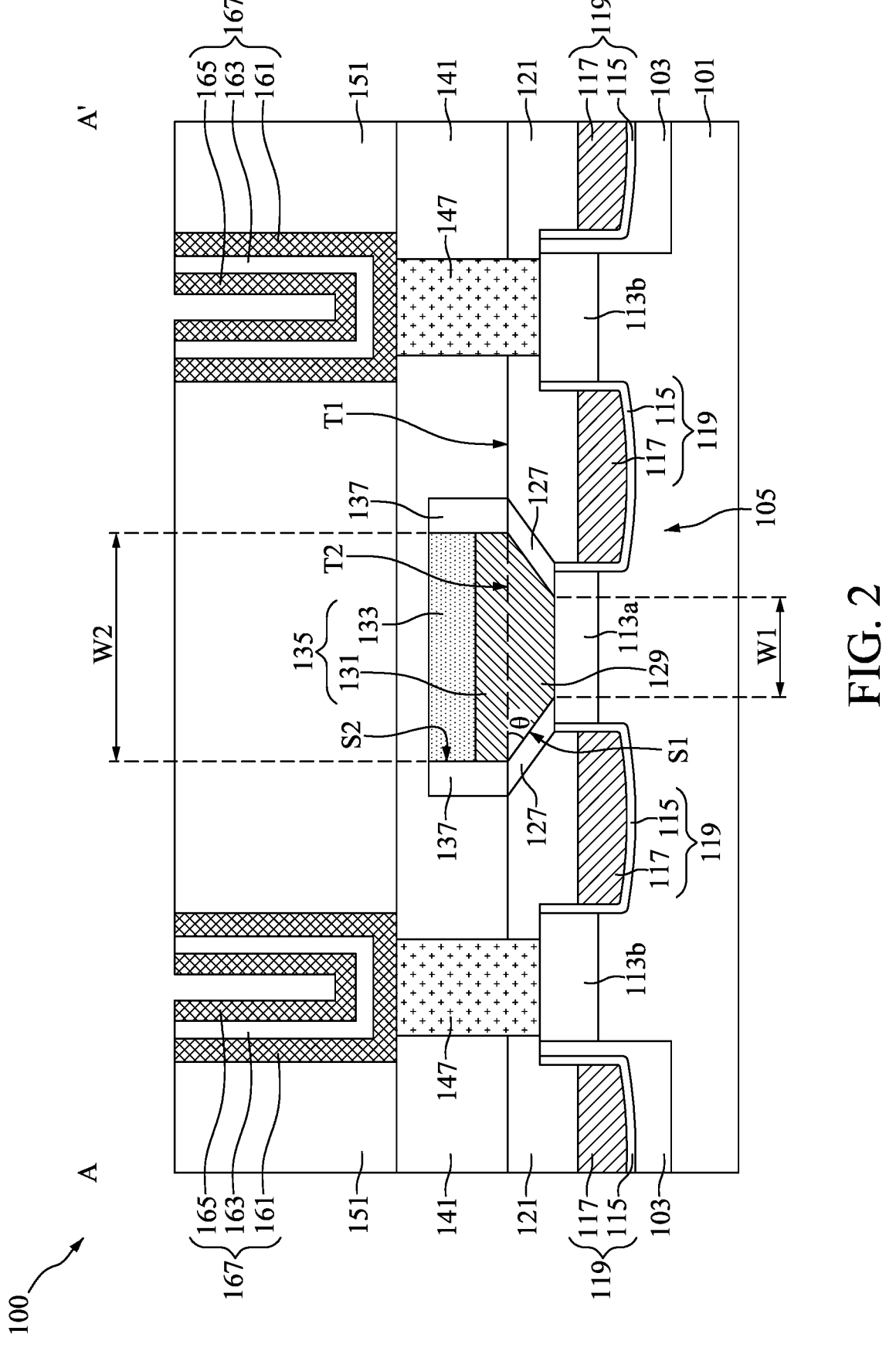
FIG. 2 is a cross-sectional view illustrating the memory device along the sectional line A-A' in FIG. 1, in accordance with some embodiments.

FIG. 1 is a top view illustrating a memory device 100, FIG. 2 is a cross-sectional view illustrating the memory device 100 along the sectional line A-A' in FIG. 1, in accordance with some embodiments.

As shown in FIGS. 1 and 2, the memory device 100 includes a semiconductor substrate 101, an isolation structure 103 disposed in the semiconductor substrate 101 defining a plurality of active regions 105, a plurality of word lines 119 (i.e., gate structures) extending across the active regions 105, and a plurality of source/drain regions 113a and 113b in the active regions 105 separated by the word lines 119. In some embodiments, each of the active regions 105 includes two source/drain regions 113b and one source/drain region 113a disposed between the source/drain regions 113b. The source/drain regions 113a are also referred to as the first source/drain regions, and the source/drain regions 113b are also referred to as the second source/drain regions. Moreover, each of the word lines 119 includes a gate dielectric layer 115 and a gate electrode 117 surrounded by the gate dielectric layer 115.

The memory device 100 also includes a dielectric cap layer 121 covering the word lines 119, a plurality of bit line contacts 129 penetrating through the dielectric cap layer 121, and each of the bit line contacts 129 is separated from the dielectric cap layer 121 by a bit line contact spacer 127. In some embodiments, the bit line contact spacers 127 are in direct contact with the gate dielectric layers 115 of the word lines 119. In some embodiments, the bit line contacts 129 and the bit line contact spacers 127 are in direct contact with the source/drain regions 113a in the active regions 105.

In some embodiments, each of the bit line contacts 129 has a tapered profile along a direction from the top surface T1 of the dielectric cap layer 121 towards the source/drain region 113a. In some embodiments, an angle θ between the top surface T2 and the sidewall S1 of the bit line contact 129 is in a range from about 73 degrees to about 81 degrees.

The memory device 100 further includes a dielectric layer 141 disposed over the dielectric cap layer 121, and a plurality of bit lines 135 disposed in the dielectric layer 141. In some embodiments, each of the bit lines 135 includes a lower bit line layer 131 and an upper bit line layer 133 disposed over the lower bit line layer 131. In some embodiments, the bit lines 135 are disposed over the bit line contacts 129, and the bit lines 135 are electrically connected to the source/drain regions 113a through the bit line contacts 129.

In some embodiments, the bit line contact 129 has a bottom width W1 and a top width W2. In some embodiments, the top width W2 is greater than the bottom width W1 such that the bit line contact 129 has a tapered profile along a direction from the top surface T1 of the dielectric cap layer 121 towards the source/drain region 113a. In some embodiments, the ratio of the top width W2 to the bottom width W1 of the bit line contact 129 is in a range from about 1.45 to about 1.85.

In some embodiments, the memory device 100 includes bit line spacers 137 covering sidewalls S2 of the bit lines 135. In some embodiments, the bit line spacers 137 are in direct contact with the bit line contact spacers 127. In addition, the memory device 100 includes a plurality of capacitor contacts 147 penetrating through the dielectric layer 141 and the dielectric cap layer 121 to electrically connect to the source/drain regions 113b. The memory device 100 also includes a dielectric layer 151 disposed over the dielectric layer 141, and a plurality of capacitors 167 disposed in the dielectric layer 151 to electrically connect to the source/drain regions 113b through the capacitor contacts 147. In some embodiments, each of the capacitors 167 includes a bottom electrode 161, a top electrode 165 disposed over and surrounded by the bottom electrode 161, and a capacitor dielectric layer 163 disposed between and in direct contact with the bottom electrode 161 and the top electrode 165.

In some embodiments, the memory device 100 includes bit line contacts 129 with tapered profiles, and the bit line contacts 129 are tapered along a direction from the top surface T1 of the dielectric cap layer 121 towards the source/drain regions 113a. Therefore, overlay or alignment failure issues may be reduced, and leakage current between source/drain regions 113a and 113b may be avoided. As a result, the overall device performance may be improved, and the yield rate of the memory device 100 may be increased.

FIG. 3 is a flow diagram illustrating a method 10 for preparing the memory device 100, and the method 10 includes steps S11, S13, S15, S17, S19, S21, S23, S25, S27 and S29, in accordance with some embodiments. The steps S11 to S29 of FIG. 3 are elaborated in connection with the following figures.

FIGS. 4, 6, 8, 10, 12, 14, 16, 18 and 20 are top views illustrating intermediate stages in the formation of the memory device 100, and FIGS. 5, 7, 9, 11, 13, 15, 17, 19 and 21 are cross-sectional views illustrating intermediate stages in the formation of the memory device 100, in accordance with some embodiments. It should be noted that FIGS. 5, 7, 9, 11, 13, 15, 17, 19 and 21 are cross-sectional views along the sectional line A-A' of FIGS. 4, 6, 8, 10, 12, 14, 16, 18 and 20, respectively.

Figure 4:
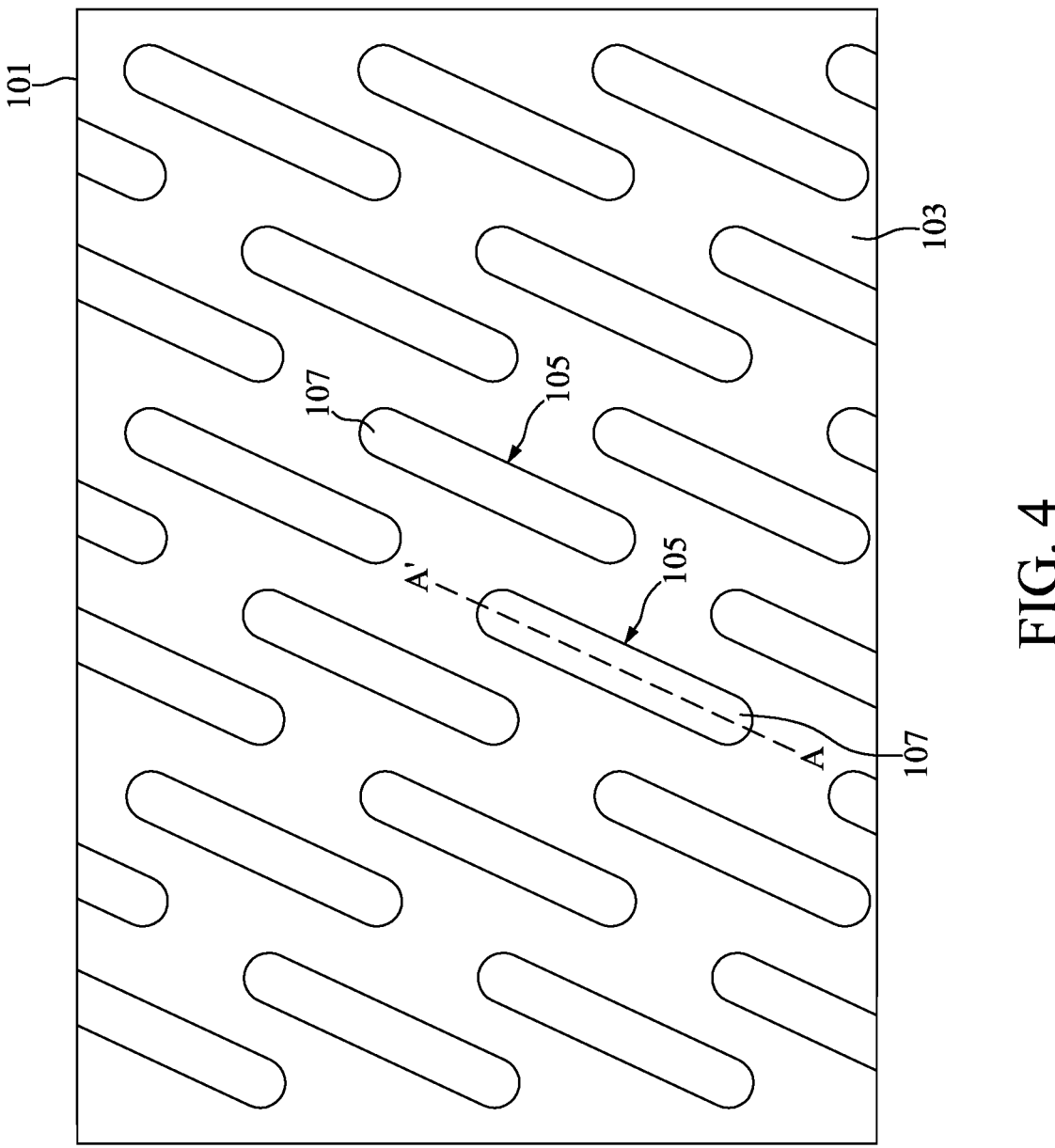
FIG. 4 is a top view illustrating an intermediate stage of forming active regions in a semiconductor substrate during the formation of the memory device, in accordance with some embodiments.
Figure 5:
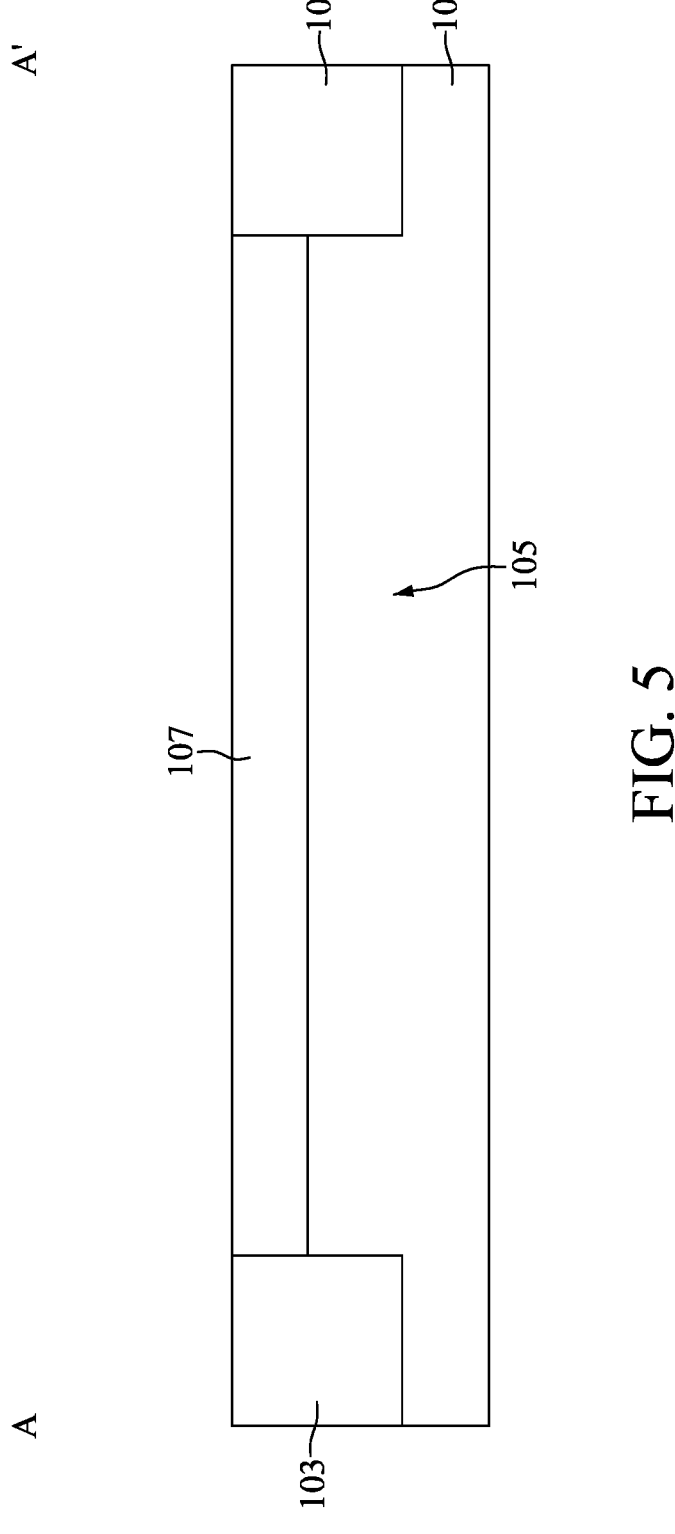
FIG. 5 is a cross-sectional view illustrating an intermediate stage in the formation of the memory device along the sectional line A-A' in FIG. 4, in accordance with some embodiments.

As shown in FIGS. 4 and 5, a semiconductor substrate 101 is provided. The semiconductor substrate 101 may be a semiconductor wafer such as a silicon wafer. Alternatively or additionally, the semiconductor substrate 101 may include elementary semiconductor materials, compound semiconductor materials, and/or alloy semiconductor materials. Examples of the elementary semiconductor materials may include, but are not limited to, crystal silicon, polycrystalline silicon, amorphous silicon, germanium, and/or diamond. Examples of the compound semiconductor materials may include, but are not limited to, silicon carbide, gallium arsenic, gallium phosphide, indium phosphide, indium arsenide, and/or indium antimonide. Examples of the alloy semiconductor materials may include, but are not limited to, SiGe, GaAsP, AlInAs, AlGaAs, GaInAs, GaInP, and/or GaInAsP.

In some embodiments, the semiconductor substrate 101 includes an epitaxial layer. For example, the semiconductor substrate 101 has an epitaxial layer overlying a bulk semiconductor. In some embodiments, the semiconductor substrate 101 is a semiconductor-on-insulator substrate which may include a substrate, a buried oxide layer over the substrate, and a semiconductor layer over the buried oxide layer, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods.

Still referring to FIGS. 4 and 5, an isolation structure 103 is formed in the semiconductor substrate 101 to define active regions 105, and the isolation structure 103 is a shallow trench isolation (STI) structure, in accordance with some embodiments. In addition, the isolation structure 103 may be made of silicon oxide, silicon nitride, silicon oxynitride or another suitable dielectric material, and the formation of the isolation structure 103 may include forming a patterned mask (not shown) over the semiconductor substrate 101, etching the semiconductor substrate 101 to form openings (not shown) by using the patterned mask as a mask, depositing a dielectric material in the openings and over the semiconductor substrate 101, and planarizing the dielectric material until the semiconductor substrate 101 is exposed.

Moreover, doped regions 107 are formed in the active regions 105 defined by the isolation structure 103. The respective step is illustrated as the step S11 in the method 10 shown in FIG. 3. In some embodiments, the doped regions 107 are formed by one or more ion implantation processes, and P-type dopants, such as boron (B), gallium (Ga), or indium (In), or N-type dopants, such as phosphorous (P) or arsenic (As), can be implanted in the active regions 105 to form the doped regions 107, depending on the conductivity type of the memory device 100. In addition, the doped regions 107 will become source/drain regions of the memory device 100 in the subsequent processes.

Figure 6:
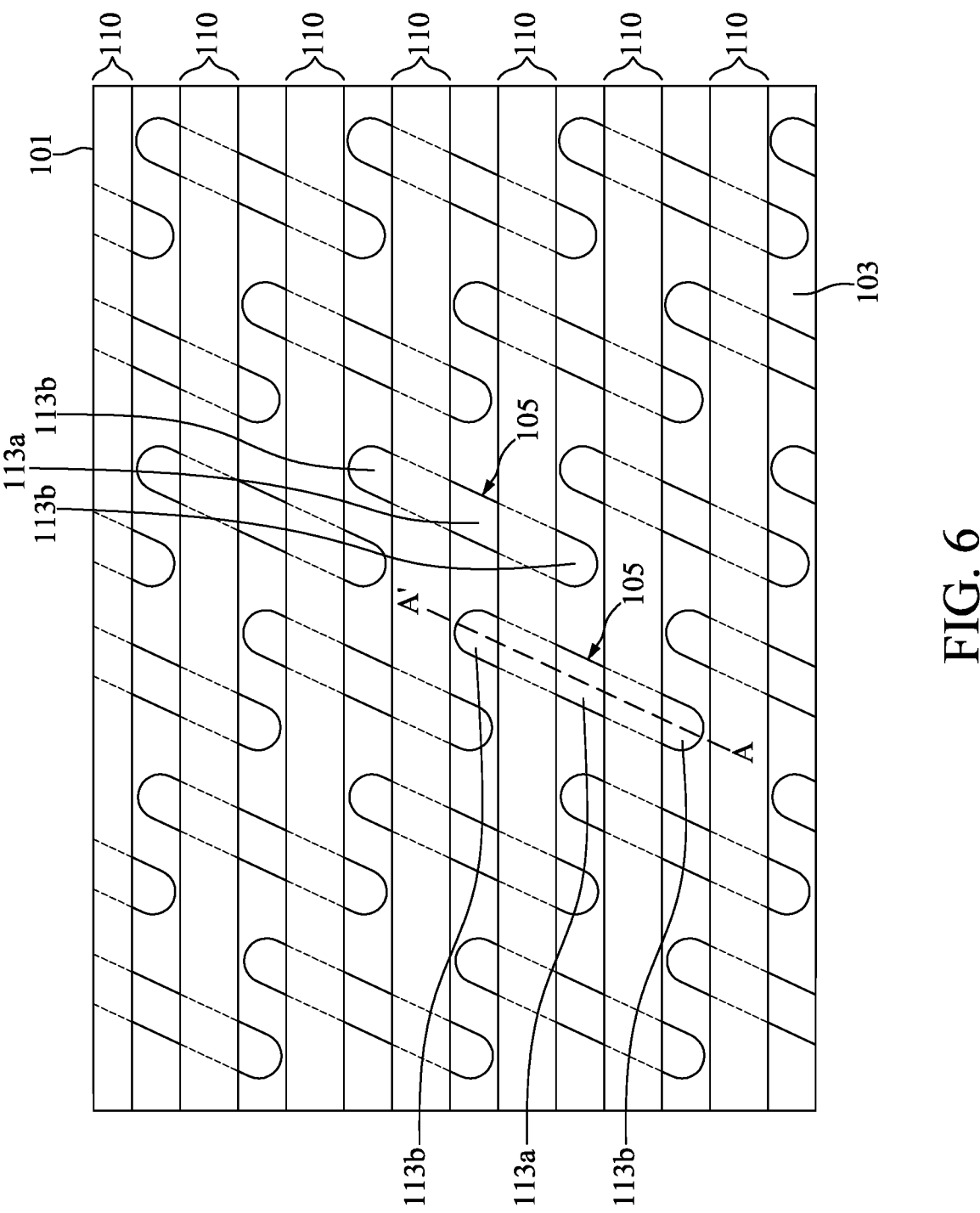
FIG. 6 is a top view illustrating an intermediate stage of forming trenches across the active regions during the formation of the memory device, in accordance with some embodiments.
Figure 7:
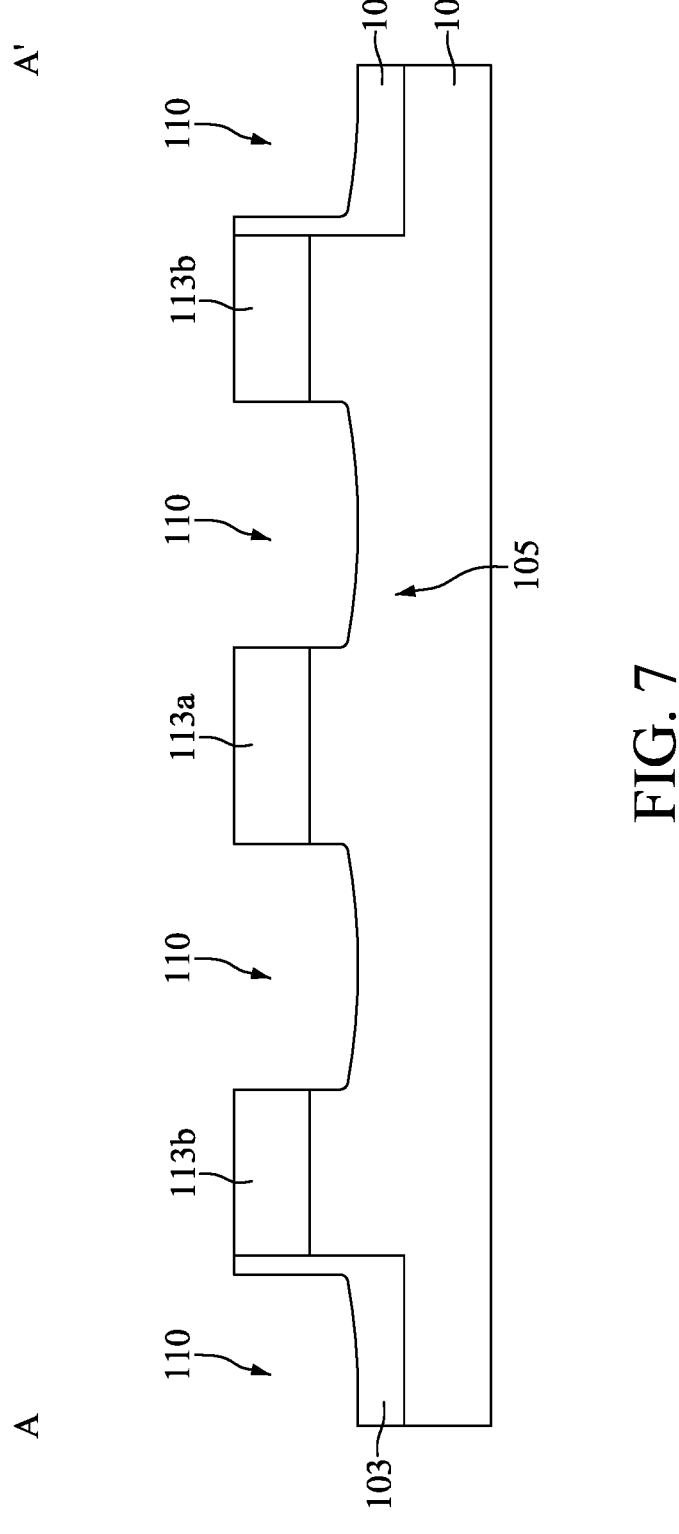
FIG. 7 is a cross-sectional view illustrating an intermediate stage in the formation of the memory device along the sectional line A-A' in FIG. 6, in accordance with some embodiments.

After the doped regions 107 are formed, the semiconductor substrate 101 is etched to form a plurality of trenches 110, as shown in FIGS. 6 and 7 in accordance with some embodiments. In some embodiments, the trenches 110 are parallel to each other. In some embodiments, the trenches 110 extending across the doped regions 107 (see FIGS. 4 and 5) in the active regions 105 to form the source/drain regions 113a and 113b.

In some embodiments, the source/drain regions 113b are located at the opposite end portions of the active regions 105, and the source/drain regions 113a are located at the middle portions of the active regions 105. The formation of the trenches 110 may include forming a patterned mask (not shown) over the semiconductor substrate 101, and etching the semiconductor substrate 101 by using the patterned mask as a mask. After the trenches 110 are formed, the pattered mask may be removed.

Figure 8:
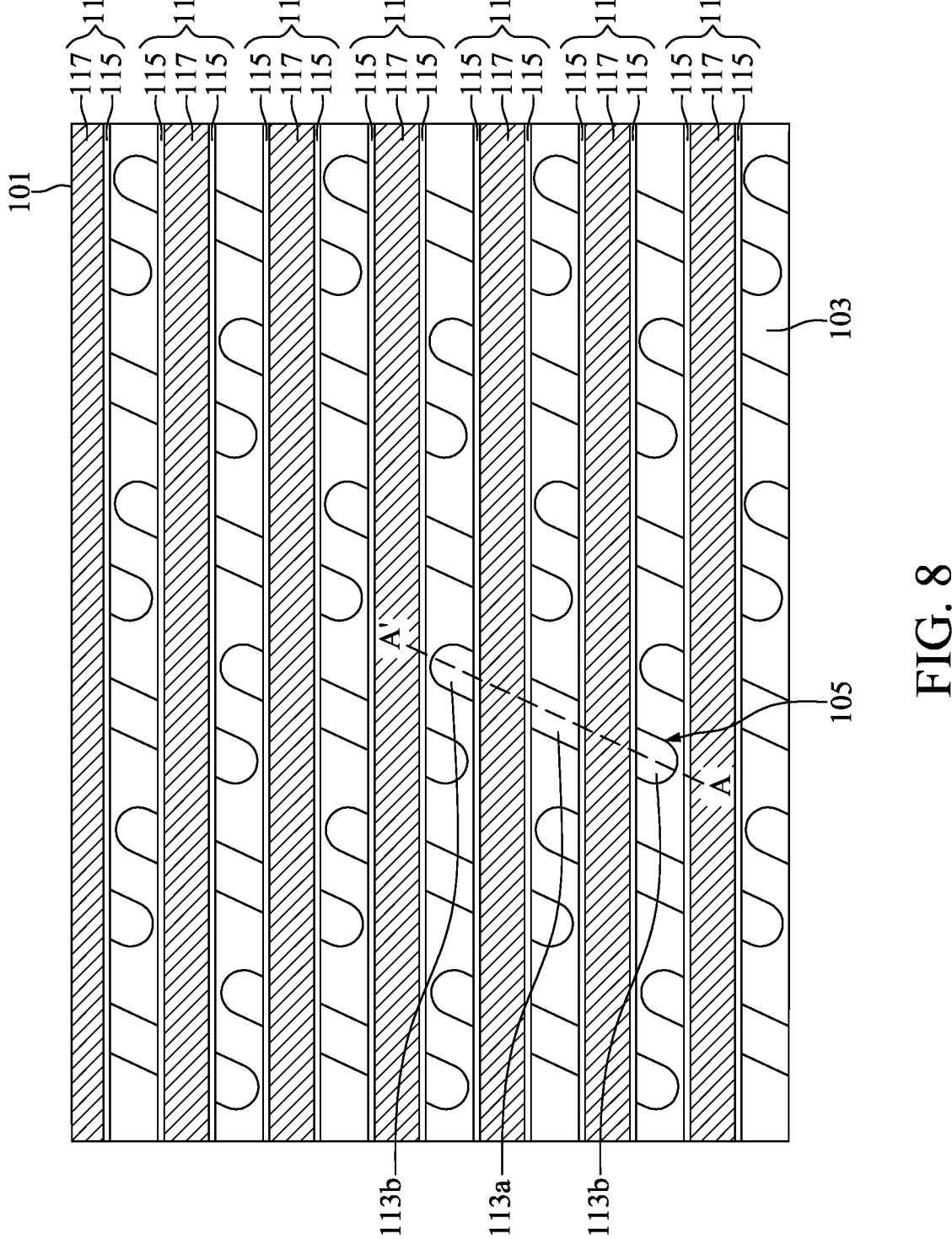
FIG. 8 is a top view illustrating an intermediate stage of forming word lines in the trenches during the formation of the memory device, in accordance with some embodiments.
Figure 9:
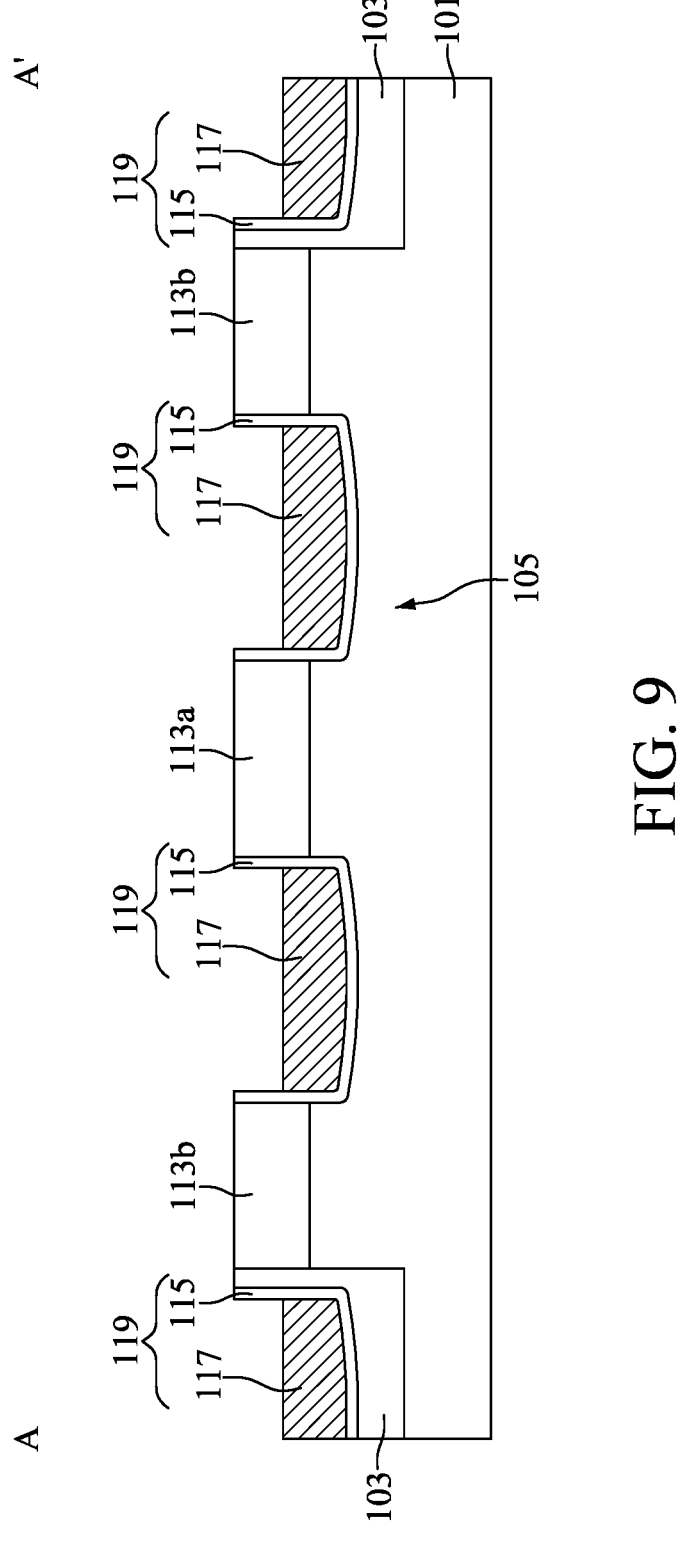
FIG. 9 is a cross-sectional view illustrating an intermediate stage in the formation of the memory device along the sectional line A-A' in FIG. 8, in accordance with some embodiments.

Next, word lines 119 (i.e., gate structures) are formed in the trenches 110, as shown in FIGS. 8 and 9 in accordance with some embodiments. The respective step is illustrated as the step S13 in the method 10 shown in FIG. 3. In some embodiments, the word lines 119 include gate dielectric layers 115 and gate electrodes 117.

In some embodiments, the gate dielectric layers 115 are made of silicon oxide, silicon nitride, silicon oxynitride, a dielectric material with high dielectric constant (high-k), or a combination thereof, and the gate electrodes 117 are made of a conductive material such as aluminum (Al), copper (Cu), tungsten (W), titanium (Ti), tantalum (Ta), or may be a multi-layer structure including any combination of the above materials. In some embodiments, barrier layers (not shown) are formed between the gate dielectric layers 115 and the gate electrodes 117.

The formation of the gate dielectric layers 115 may include conformally depositing a gate dielectric material (not shown) over the inner surfaces of the trenches 110 and the top surface of the semiconductor substrate 101, and planarizing the gate dielectric material to expose the top surface of the semiconductor substrate 101. After the gate dielectric layers 115 are formed, the formation of the gate electrodes 117 may include depositing a gate electrode material (not shown) over the gate dielectric layers 115, and recessing the gate electrode material to form the gate electrodes 117.

The deposition process of the gate dielectric material may include a chemical vapor deposition (CVD) process, a physical vapor deposition (PVD) process, an atomic layer deposition (ALD) process, a spin-coating process, or another suitable process. The planarization process of the gate dielectric material may include a chemical mechanical polishing (CMP) process. The deposition processes of the gate electrode material may include one or more deposition processes, such as a CVD process, a PVD process, an ALD process, a plasma enhanced chemical vapor deposition (PECVD) process, a metal organic chemical vapor deposition (MOCVD) process, a plating process, a sputtering process or another suitable deposition process. The gate electrode material may be recessed through an etch-back process, such that the top surfaces of the gate electrodes 117 are lower than the top surface of the semiconductor substrate 101. The etch-back process may include a wet etching process, a dry etching process, or a combination thereof.

Figure 10:
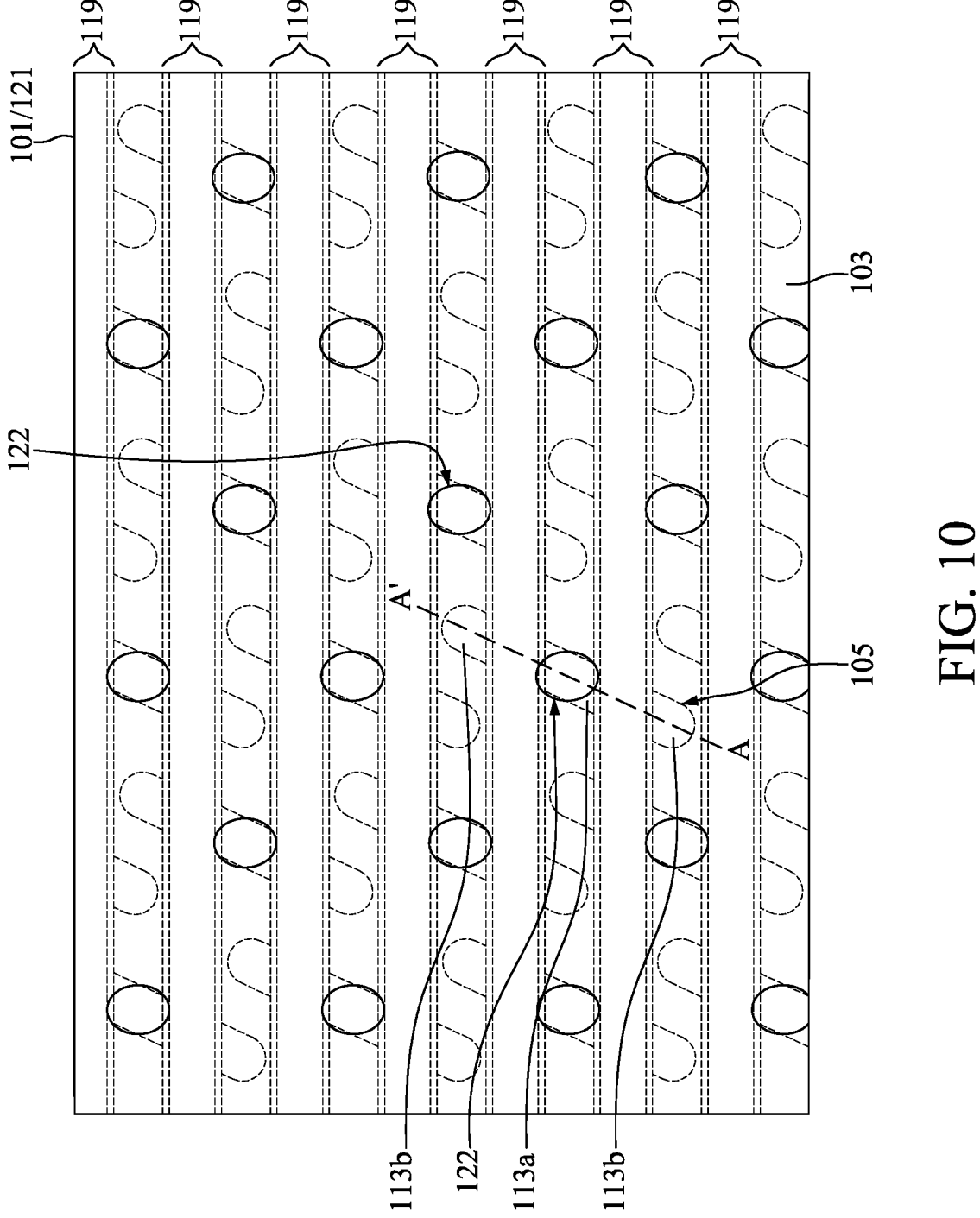
FIG. 10 is a top view illustrating an intermediate stage of forming a dielectric cap layer over the word lines, and forming first openings penetrating through the dielectric cap layer during the formation of the memory device, in accordance with some embodiments.
Figure 11:
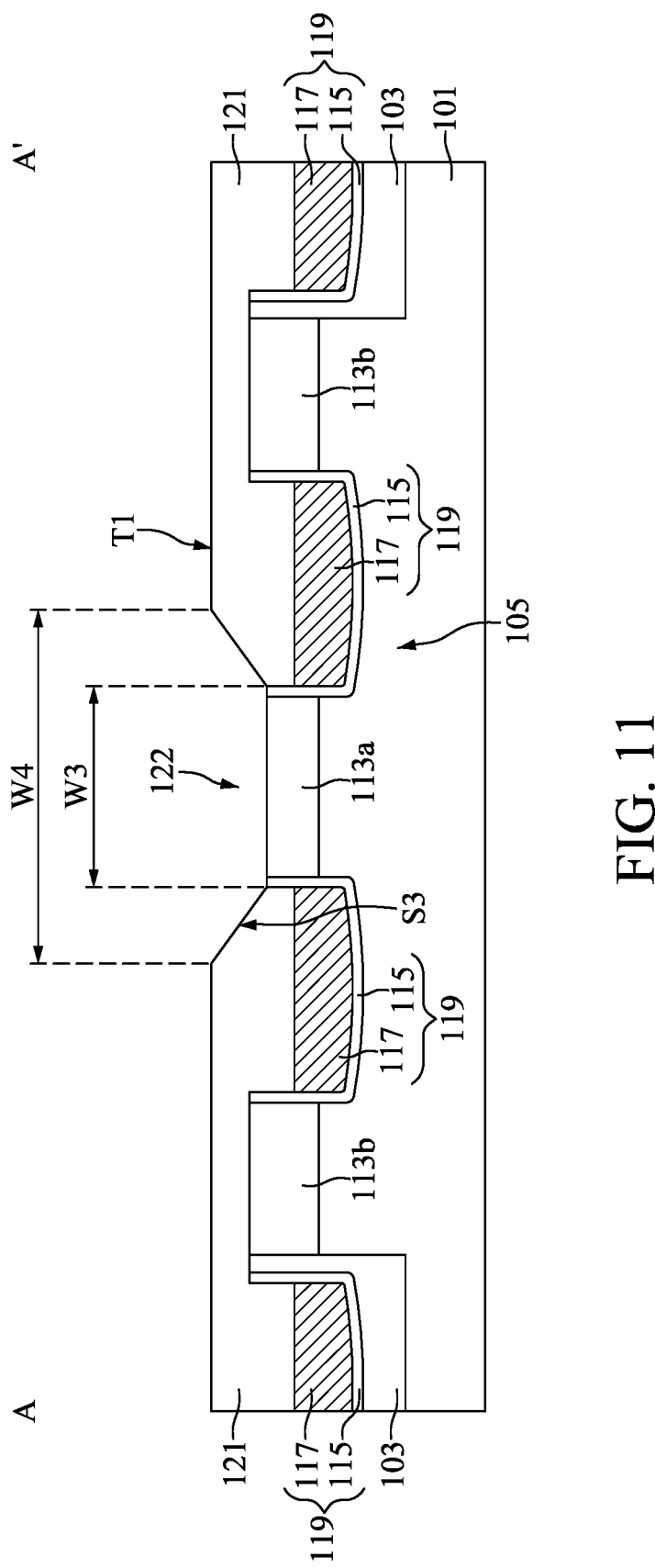
FIG. 11 is a cross-sectional view illustrating an intermediate stage in the formation of the memory device along the sectional line A-A' in FIG. 10, in accordance with some embodiments.

Subsequently, a dielectric cap layer 121 is formed covering the word lines 119 and the source/drain regions 113a and 113b, and the dielectric cap layer 121 is partially removed to form openings 122 (also referred to as first openings) exposing the source/drain regions 113a, as shown in FIGS. 10 and 11 in accordance with some embodiments. The respective steps are illustrated as the steps S15 and S17 in the method 10 shown in FIG. 3. In some embodiments, the remaining portions of the trenches 110 over the gate electrodes 117 of the word lines 119 are filled by the dielectric cap layer 121. In some embodiments, the portions of the dielectric cap layer 121 filled in the trenches 110 are surrounded by the gate dielectric layers 115 of the word lines 119.

In some embodiments, the dielectric cap layer 121 is made of silicon nitride. However, any other suitable dielectric materials may be utilized, such as silicon oxide, silicon oxynitride, or another suitable dielectric material. In some embodiments, the dielectric cap layer 121 is formed by a CVD process, a PVD process, a spin-coating process, another suitable process, or a combination thereof.

In some embodiments, the dielectric cap layer 121 is etched to form openings 122 with tapered profiles. In some embodiments, the openings 122 are formed by performing a first etching process on the dielectric cap layer 121 using a first etchant gas including $CH_4/CHF_3$, and performing a second etching process on the dielectric cap layer 121 using a second etchant gas including $CH_4/CH_2F_2$ after the first etching process is performed. In some embodiments, each of the openings 122 has a tapered profile. For example, each of the openings 122 has a top width W4 and a bottom width W3, and the top width W4 is greater than the bottom width W3 such that the opening 122 has a tapered profile along a direction from the top surface T1 of the dielectric cap layer 121 towards the source/drain region 113a.

In some embodiments, the openings 122 penetrating through the dielectric cap layer 121 and exposing the source/drain regions 113a are bit line contact openings. In some embodiments, the gate dielectric layers 115 of the word lines 119 are exposed by the openings 122, while the gate electrodes 117 of the word lines 119 remain covered by the dielectric cap layer 121 after the openings 122 are formed.

Figure 12:
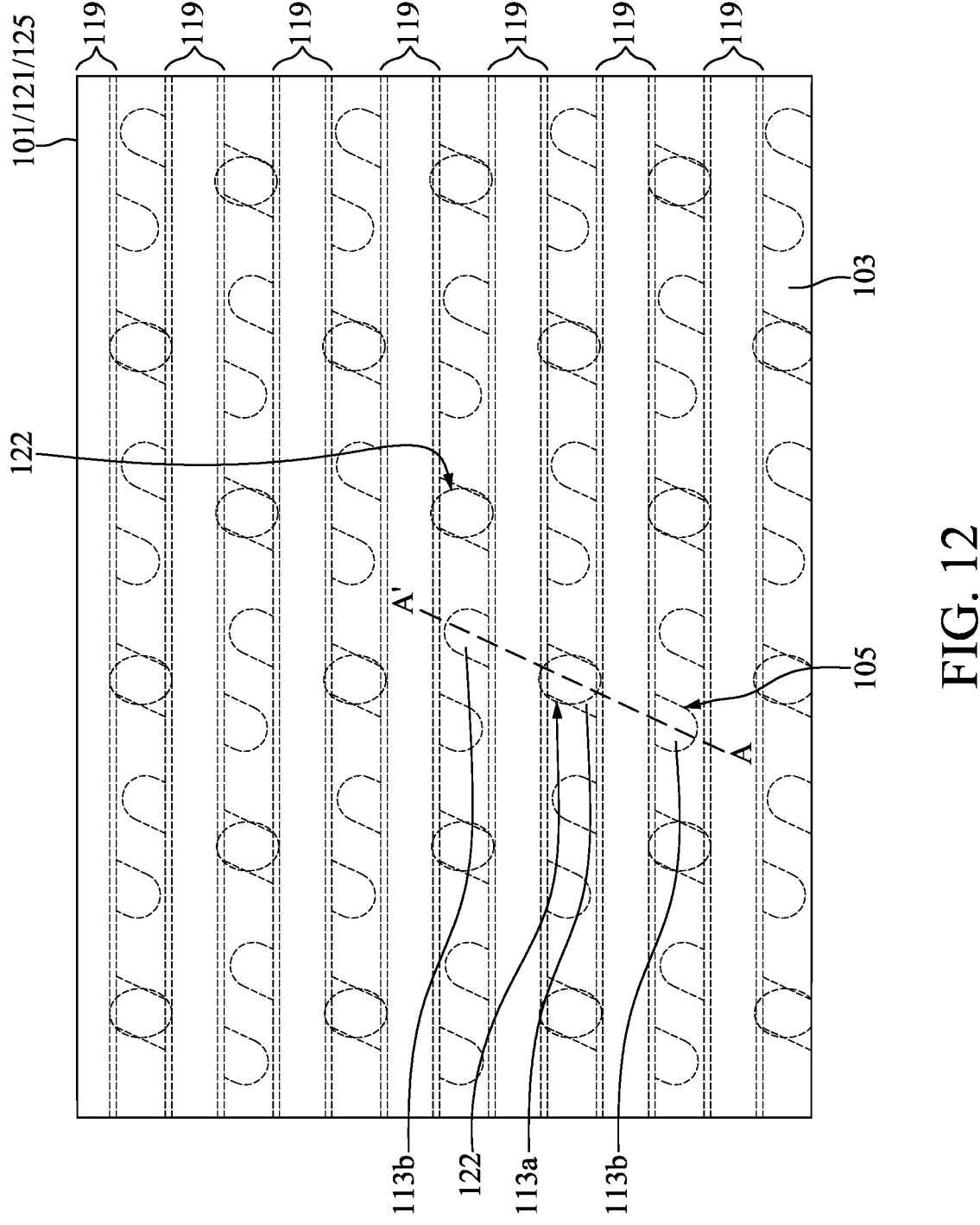
FIG. 12 is a top view illustrating an intermediate stage of depositing a spacer layer over the dielectric cap layer during the formation of the memory device, in accordance with some embodiments.
Figure 13:
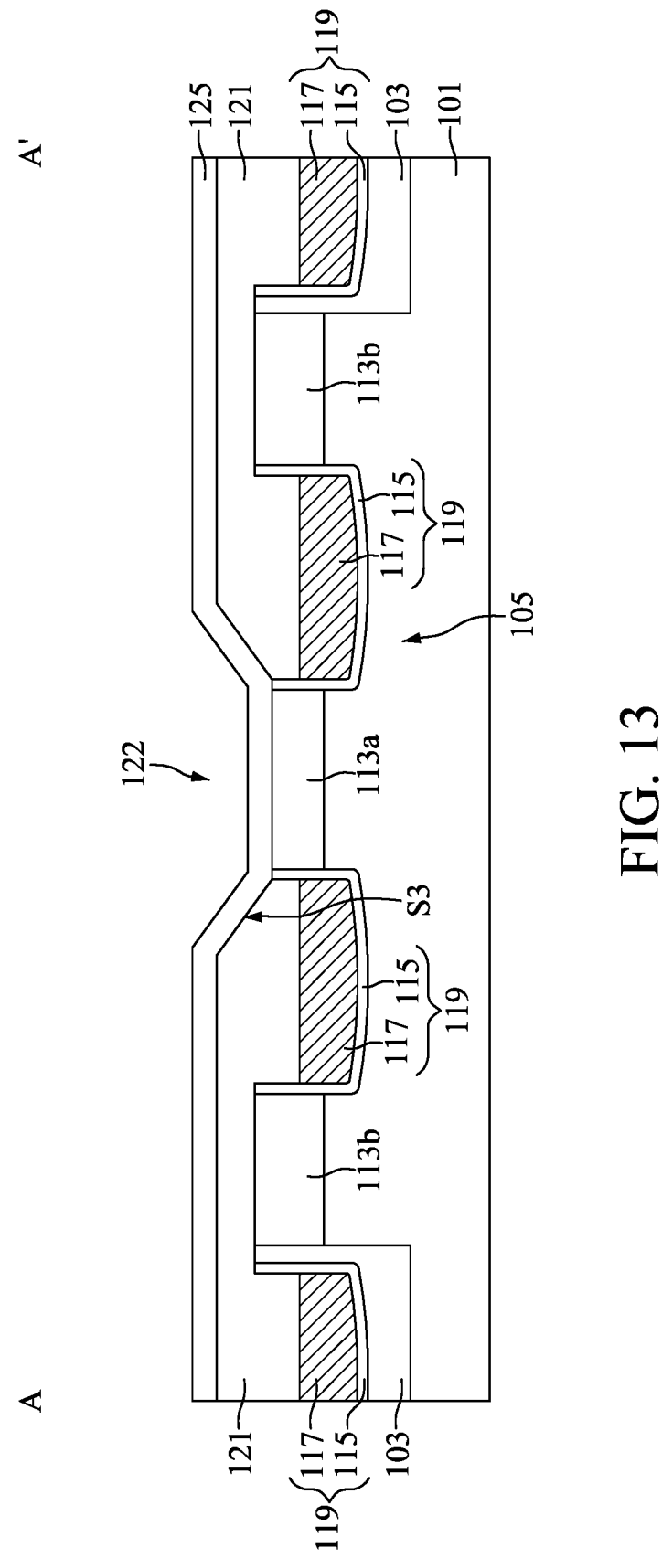
FIG. 13 is a cross-sectional view illustrating an intermediate stage in the formation of the memory device along the sectional line A-A' in FIG. 12, in accordance with some embodiments.

Then, a spacer layer 125 is conformally deposited over the dielectric cap layer 121, as shown in FIGS. 12 and 13 in accordance with some embodiments. In some embodiments, the spacer layer 125 is made of nitride. However, any other suitable dielectric materials may be utilized, such as silicon oxide, silicon nitride, silicon oxynitride, or another suitable dielectric material. In some embodiments, the spacer layer 125 is formed by a CVD process, a PVD process, a spin-coating process, another suitable process, or a combination thereof.

In some embodiments, the top surface T1 of the dielectric cap layer 121 and the (tapered) sidewalls S3 of the openings 122 are covered by the spacer layer 125. In some embodiments, the source/drain regions 113a exposed by the openings 122 are covered by the spacer layer 125. In some embodiments, the spacer layer 125 is in direct contact with the source/drain regions 113a, the gate dielectric layers 115 of the word lines 119, and the dielectric cap layer 121.

Figure 14:
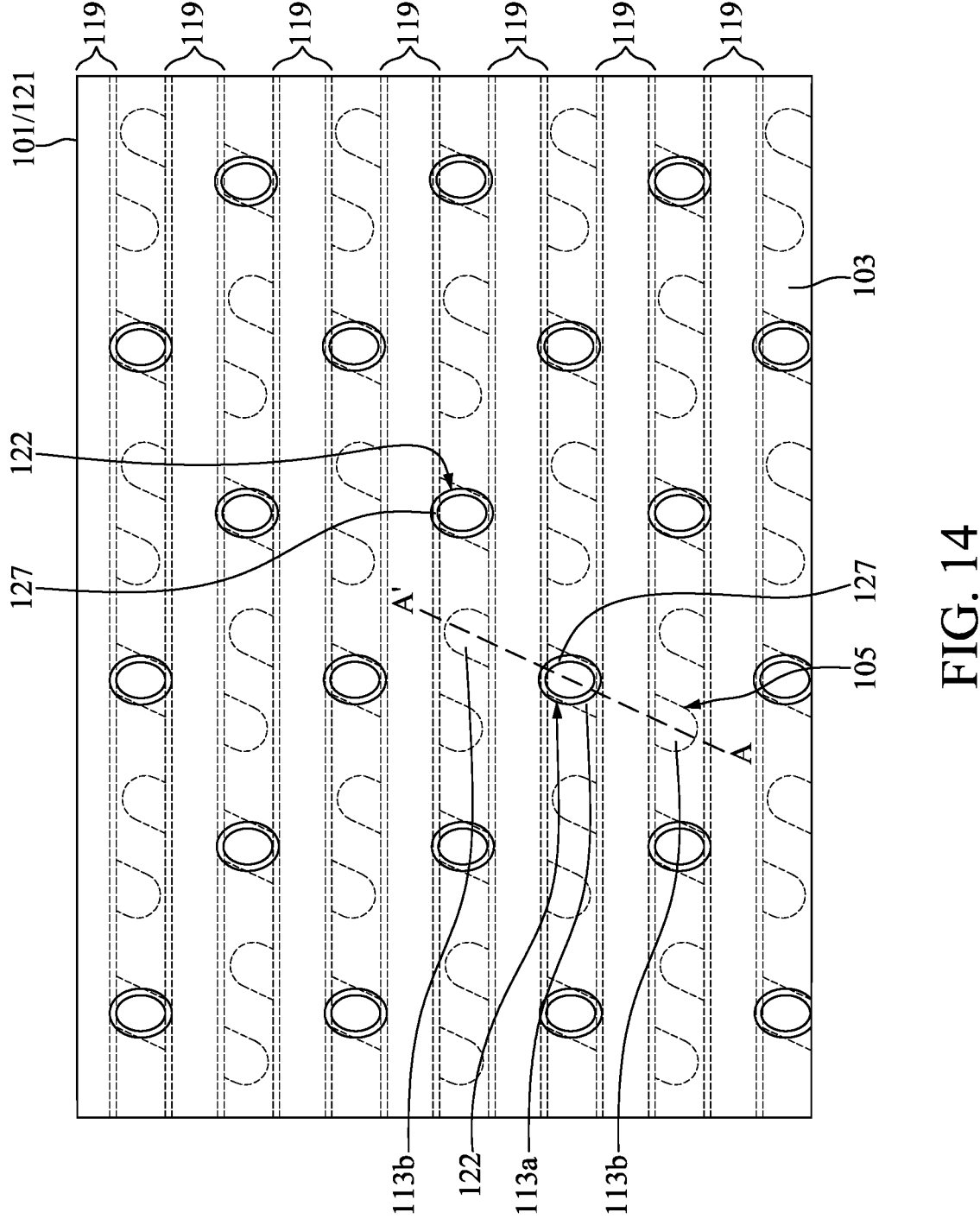
FIG. 14 is a top view illustrating an intermediate stage of partially removing the spacer layer to form bit line contact spacers in the first openings during the formation of the memory device, in accordance with some embodiments.
Figure 15:
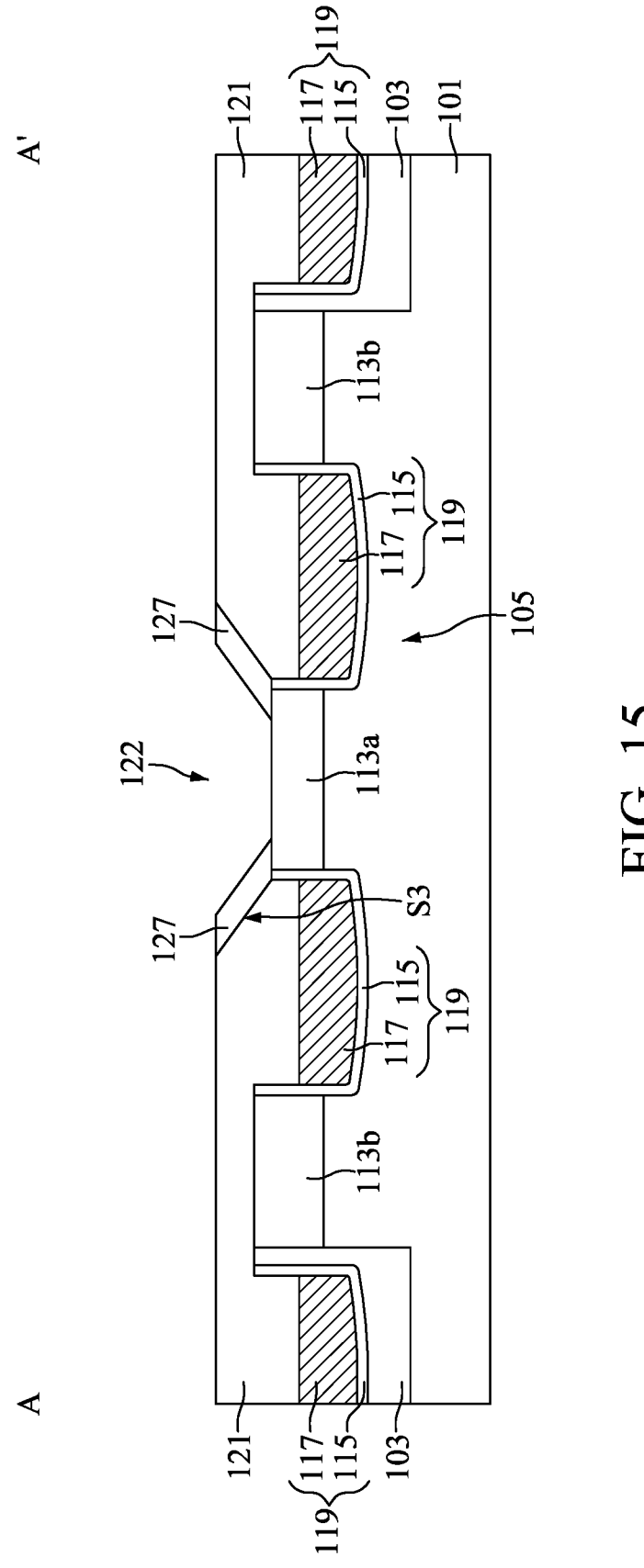
FIG. 15 is a cross-sectional view illustrating an intermediate stage in the formation of the memory device along the sectional line A-A' in FIG. 14, in accordance with some embodiments.

Next, the spacer layer 125 is partially removed by an etching process to form bit line contact spacers 127 in the openings 122, as shown in FIGS. 14 and 15 in accordance with some embodiments. The respective step is illustrated as the step S19 in the method 10 shown in FIG. 3. In some embodiments, the bit line contact spacers 127 cover the (tapered) sidewalls S3 of the openings 122.

In some embodiments, the spacer layer 125 is etched by an anisotropic etching process, which removes the same amount of the spacer material vertically in all places, leaving the bit line contact spacers 127 on the sidewalls S3 of the openings 122. In some embodiments, the etching process is a dry etching process. After the bit line contact spacers 127 are formed, the source/drain regions 113a are partially exposed.

Figure 16:
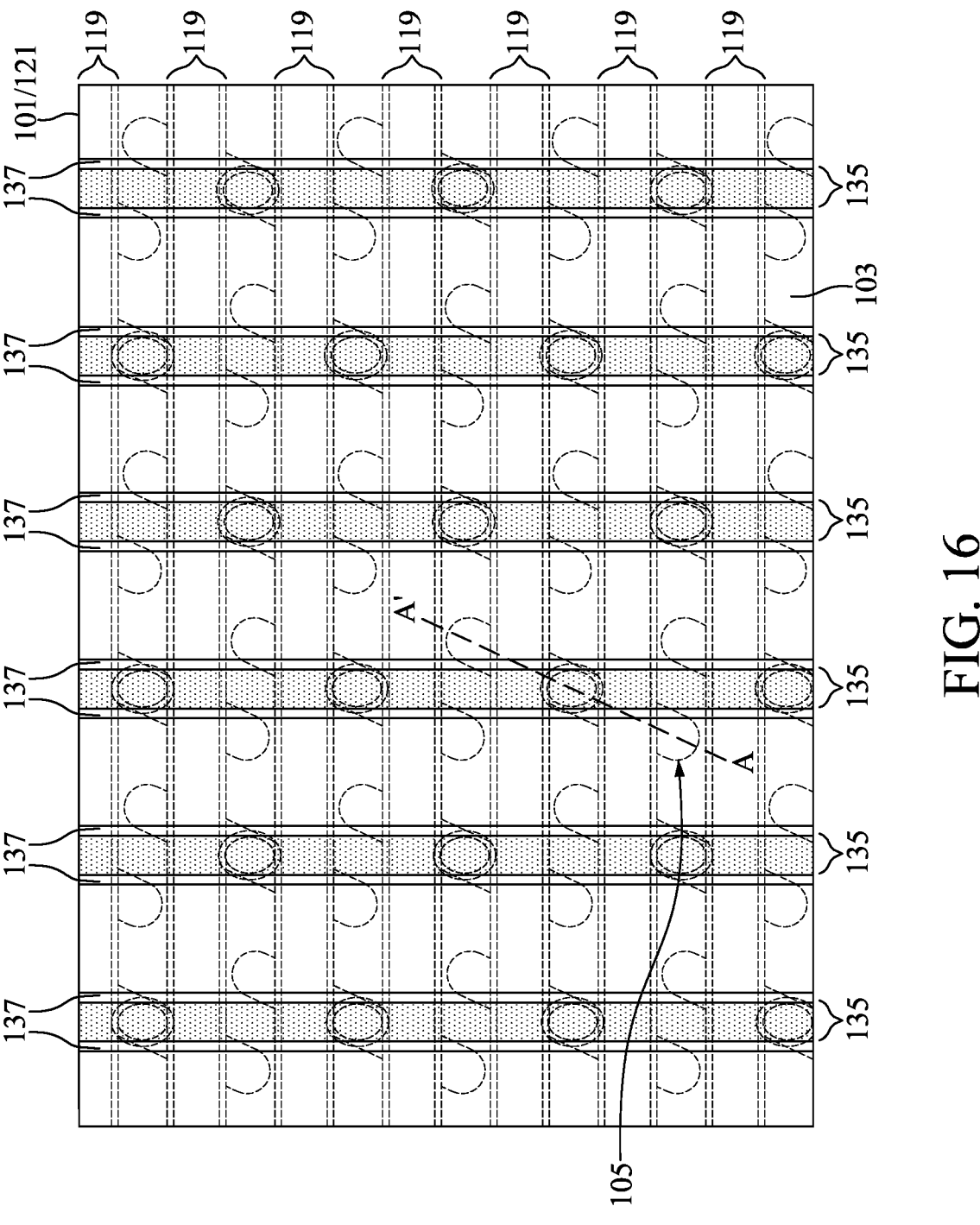
FIG. 16 is a top view illustrating an intermediate stage of forming bit line contacts in the first openings, forming bit lines over the bit line contacts, and forming bit line spacers on sidewalls of the bit lines during the formation of the memory device, in accordance with some embodiments.
Figure 17:
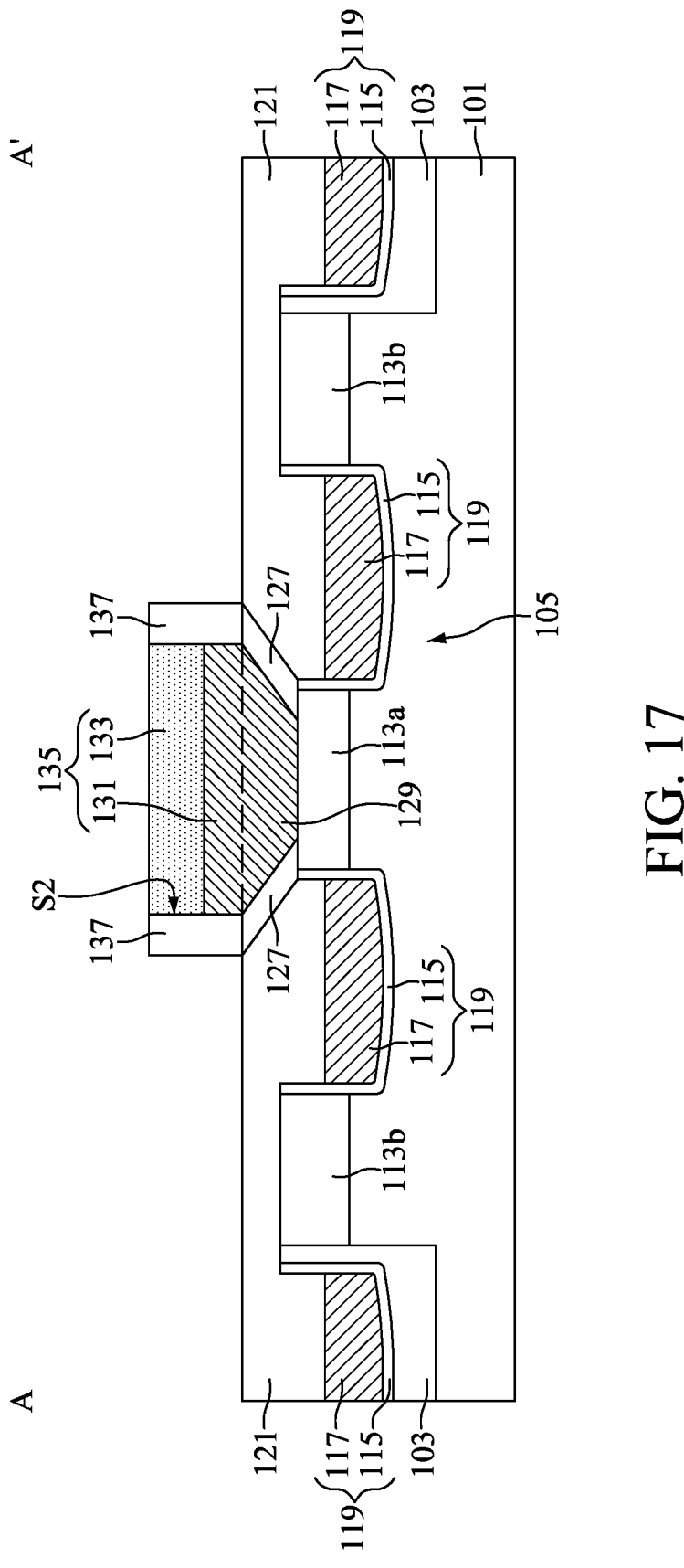
FIG. 17 is a cross-sectional view illustrating an intermediate stage in the formation of the memory device along the sectional line A-A' in FIG. 16, in accordance with some embodiments.

Subsequently, bit line contacts 129 and bit lines 135 are formed over the source/drain regions 113a, and bit line spacers 137 are formed on the sidewalls S2 of the bit lines 135, as shown in FIGS. 16 and 17 in accordance with some embodiments. The respective steps are illustrated as the steps S21 and S23 in the method 10 shown in FIG. 3. In some embodiments, the remaining portions of the openings 122 (see FIGS. 14 and 15) are filled by the bit line contacts 129, and the bit lines 135 are formed over the bit line contacts 129. In some embodiments, the bit lines 135 are electrically connected to the source/drain regions 113a through the bit line contacts 129.

As mentioned above, each of the bit lines 135 includes a lower bit line layer 131 and an upper bit line layer 133 disposed over the lower bit line layer 131. In some embodiments, the lower bit line layers 131 of the bit lines 135 and the bit line contacts 129 are formed by the same material during the same process step. In this case, the dashed line indicating the boundary of the bit line contact 129 and the lower bit line layer 131 in FIG. 17 is used to clarify the disclosure. No obvious interface exists between the bit line contact 129 and the lower bit line layer 131.

For example, a lower material (not shown) is formed over the dielectric cap layer 121 and filling the remaining portions of the openings 122 (see FIGS. 14 and 15), and an upper material (not shown) is formed over the lower material. Then, a patterned mask (not shown) is formed over the upper material, and an etching process is performed on the upper material and the lower material by using the patterned mask as a mask. In some embodiments, the remaining portions of the lower material surrounded by the bit line contact spacers 127 become bit line contacts 129, and the remaining portions of the lower material over the dielectric cap layer 121 become the lower bit line layers 131. In addition, the remaining portions of the upper material become the upper bit line layers 133. In some embodiments, the lower bit line layers 131 and the upper bit line layers 133 have aligned sidewalls. After the bit lines 135 are formed, the pattered mask may be removed.

In some embodiments, the bit line contacts 129 and the lower bit line layers 131 include doped polysilicon, metal, metal silicide, or metal compound, and the upper bit line layers 133 include one or more metals or metal compounds. The deposition processes for forming the lower material and the upper material may include CVD, PVD, ALD, PECVD, another suitable method, or a combination thereof. The etching process may include a dry etching process, a wet etching process, or a combination thereof.

After the bit lines 135 are formed, the bit line spacers 137 are formed on the sidewalls S2 of the bit lines 135, in accordance with some embodiments. In some embodiments, the bit line spacers 137 include silicon oxide, silicon nitride, silicon oxynitride or another suitable dielectric material. In some embodiments, the bit line spacers 137 are formed by a deposition process, and a subsequent etching process. The deposition process may include a CVD process, a PVD process, a spin-coating process, another suitable process, or a combination thereof. The etching process may include a dry etching process, a wet etching process, or a combination thereof.

Figure 18:
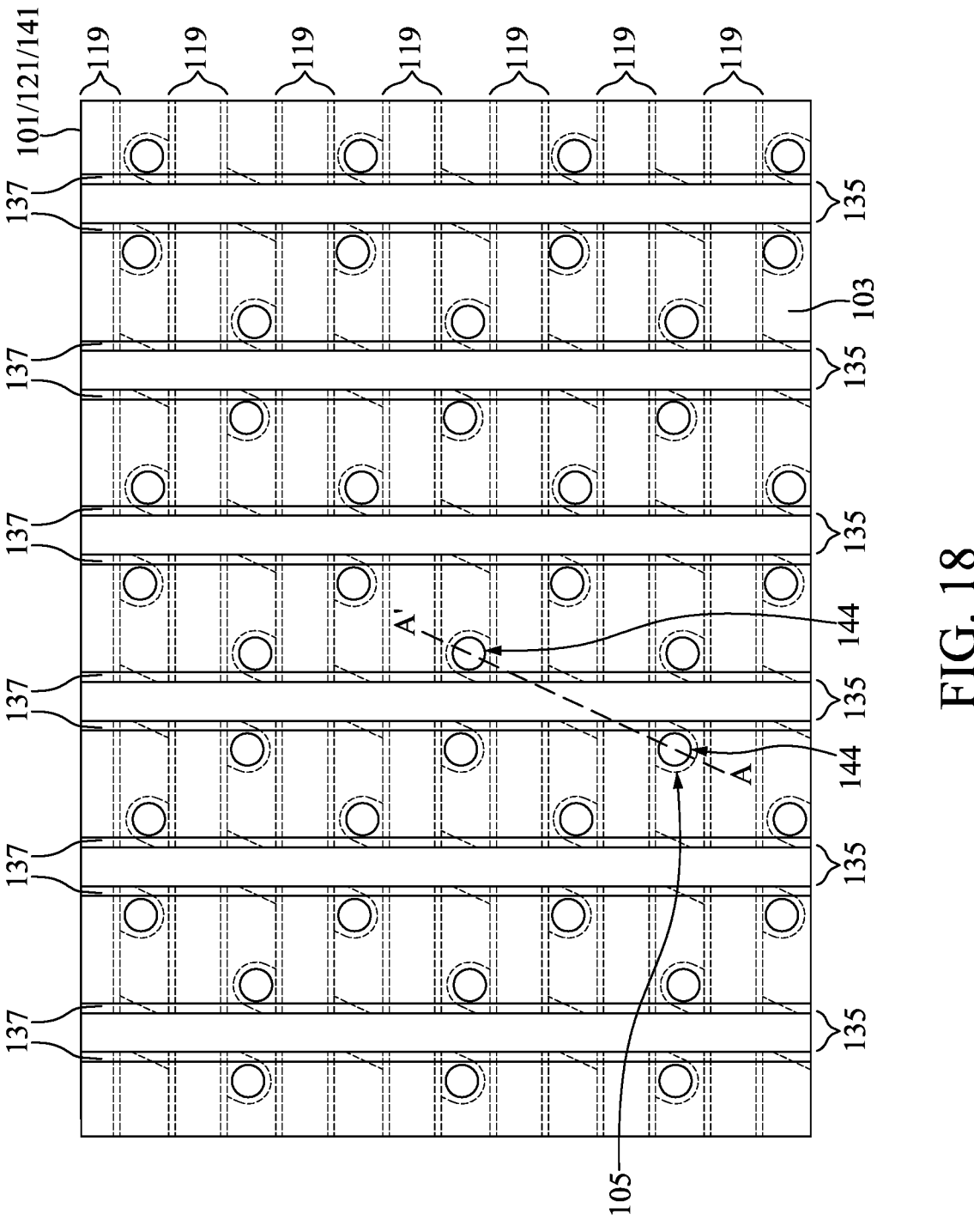
FIG. 18 is a top view illustrating an intermediate stage of forming a dielectric layer over the bit lines, and forming second openings penetrating through the dielectric layer and the dielectric cap layer during the formation of the memory device, in accordance with some embodiments.
Figure 19:
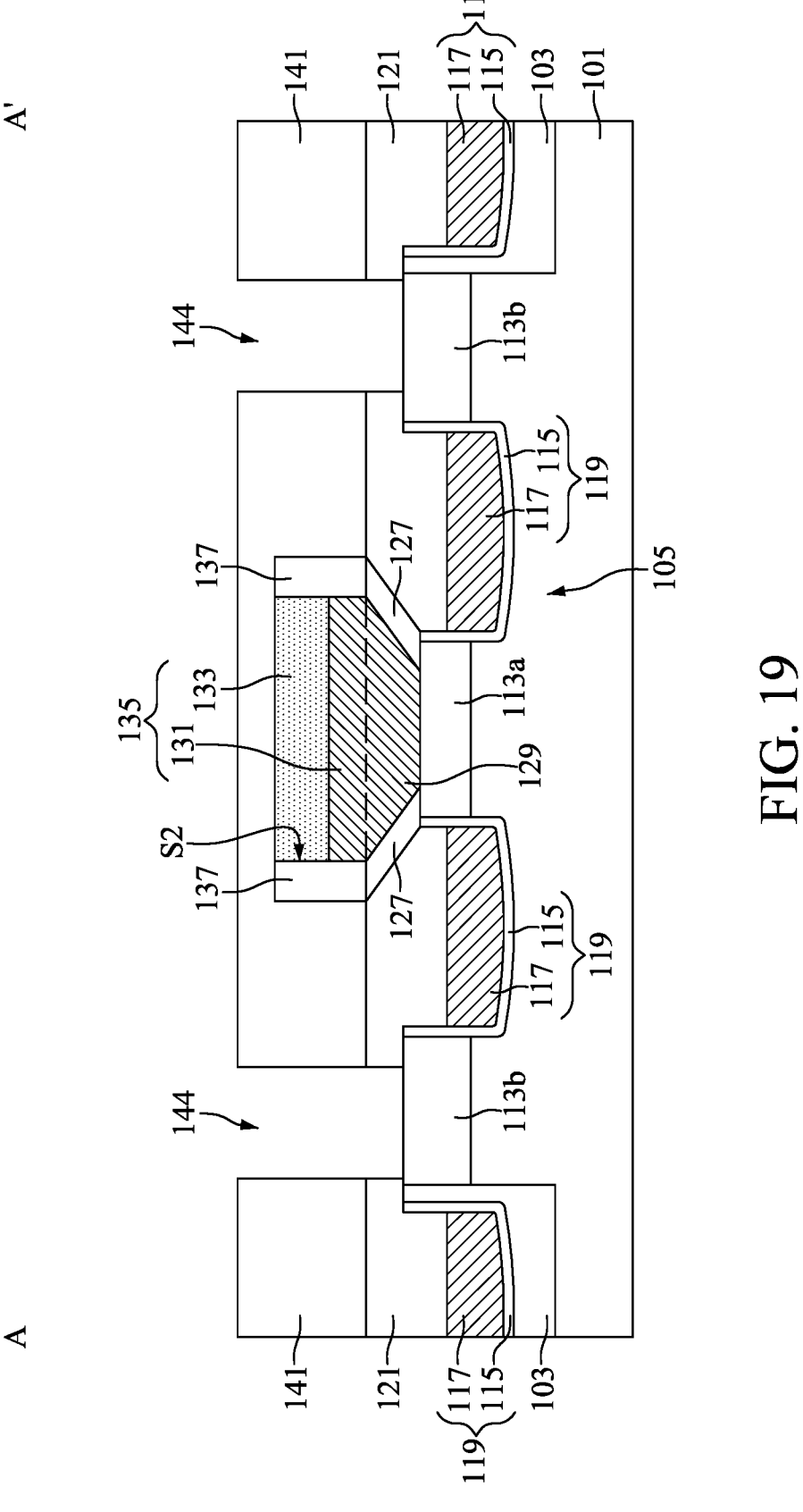
FIG. 19 is a cross-sectional view illustrating an intermediate stage in the formation of the memory device along the sectional line A-A' in FIG. 18, in accordance with some embodiments.

Then, a dielectric layer 141 is formed over the dielectric cap layer 121 and covering the bit lines 135 and the bit line spacers 137, and the dielectric layer 141 and the dielectric cap layer 121 are partially removed to form openings 144 (also referred to as second openings) exposing the source/drain regions 113b, as shown in FIGS. 18 and 19 in accordance with some embodiments. The respective step is illustrated as the step S25 in the method 10 shown in FIG. 3.

In some embodiments, the dielectric layer 141 is made of low-k dielectric materials. In some embodiments, the low-k dielectric materials have a dielectric constant (k value) less than about 4. Examples of the low-k dielectric materials include, but not limited to, silicon oxide, silicon nitride, silicon carbonitride (SiCN), silicon oxide carbonitride (SiOCN), fluorinated silica glass (FSG), carbon doped silicon oxide, amorphous fluorinated carbon, parylene, bis-benzocyclobutenes (BCB), or polyimide. In addition, the dielectric layer 141 may be formed by a deposition process, such as a CVD process, a PVD process, an ALD process, a spin coating process, or another suitable process.

The formation of the openings 144 may include forming a patterned mask (not shown) over the dielectric layer 141, and performing an etching process on the dielectric layer 141 and the dielectric cap layer 121 by using the patterned mask as a mask. The etching process may include a dry etching process, a wet etching process, or a combination thereof. After the openings 144 are formed, the pattered mask may be removed. In some embodiments, the openings 144 penetrating through the dielectric layer 141 and the dielectric cap layer 121 are capacitor contact openings.

Figure 20:
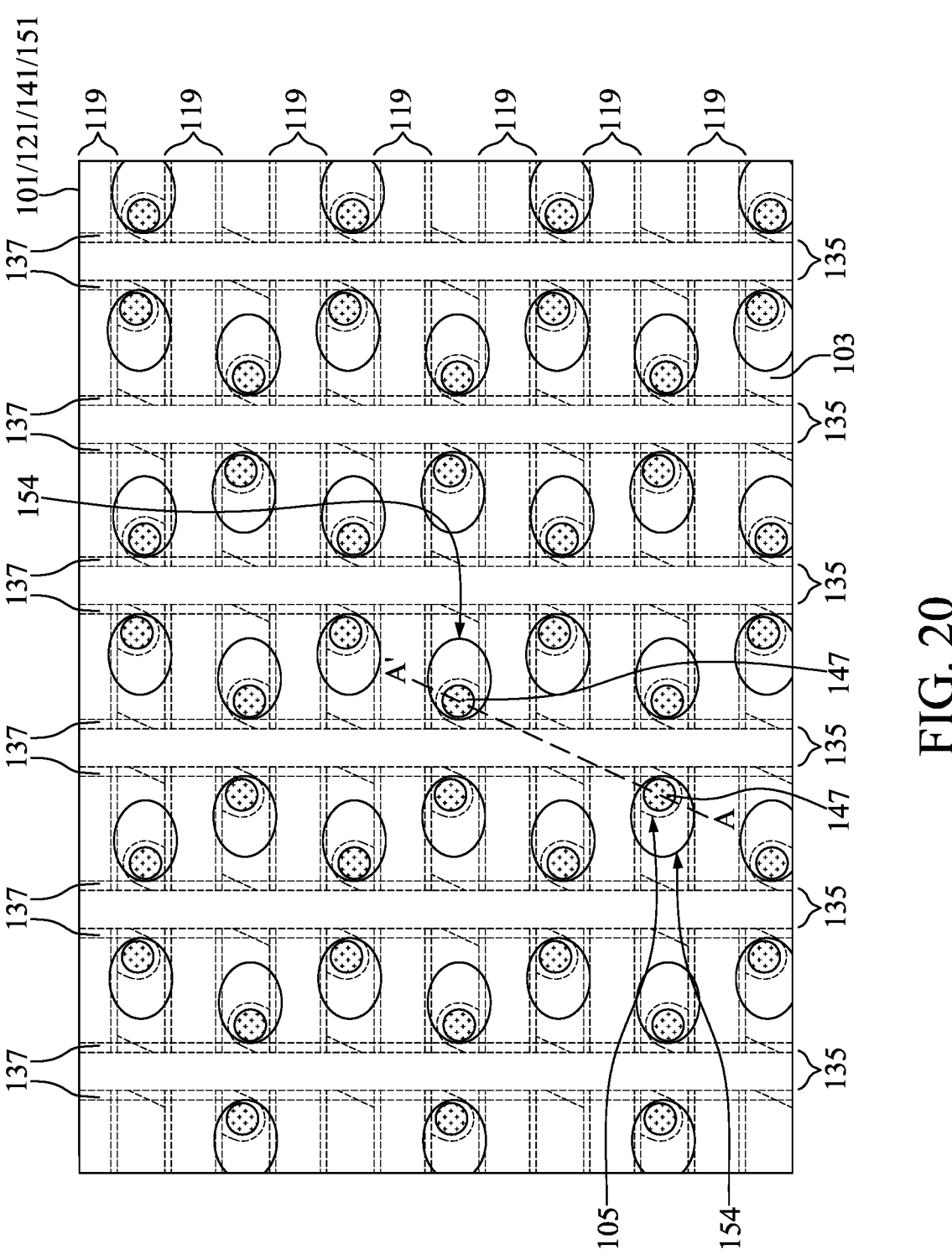
FIG. 20 is a top view illustrating an intermediate stage of forming capacitor contacts in the second openings during the formation of the memory device, in accordance with some embodiments.
Figure 21:
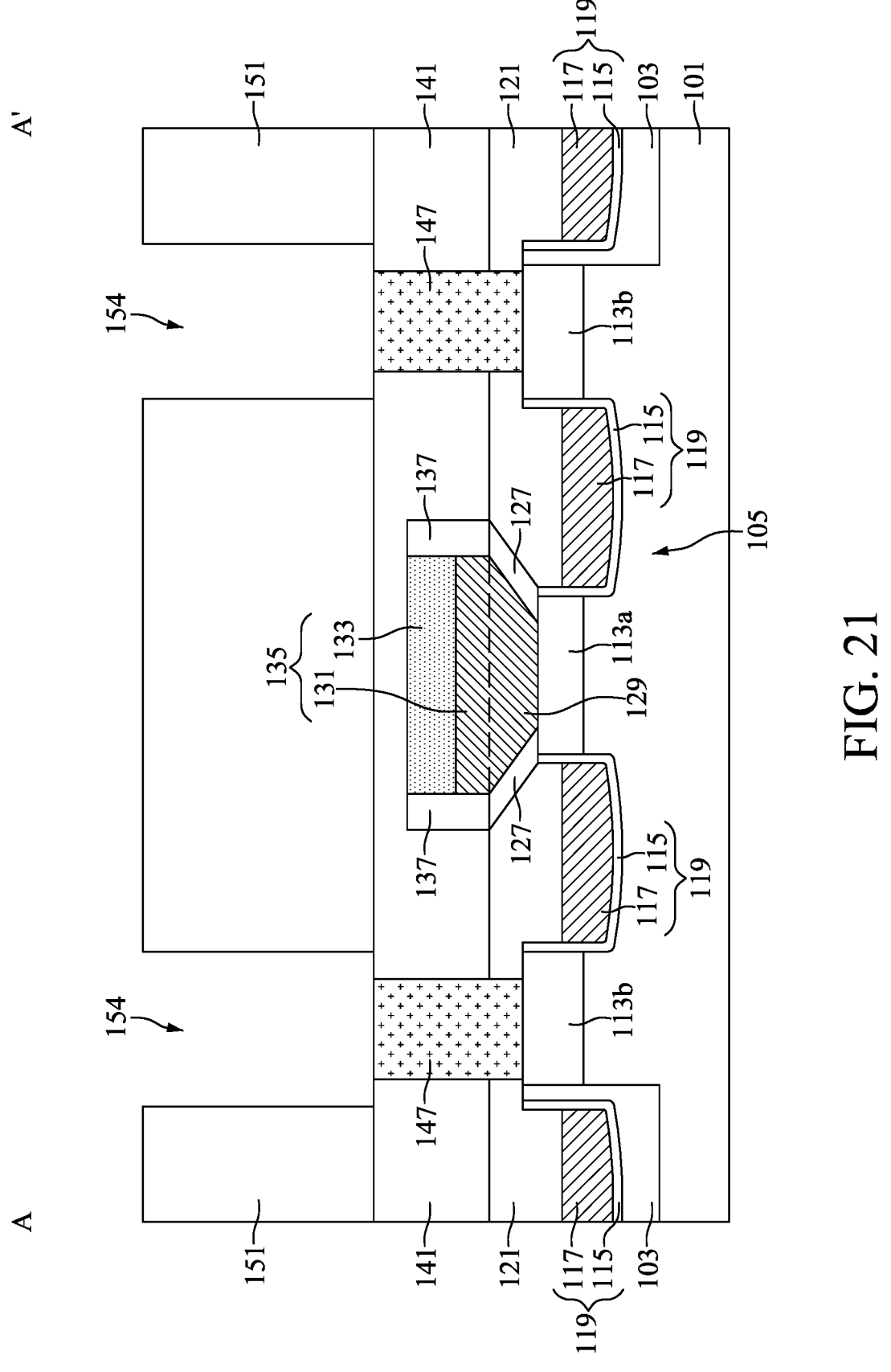
FIG. 21 is a cross-sectional view illustrating an intermediate stage in the formation of the memory device along the sectional line A-A' in FIG. 20, in accordance with some embodiments.

Next, capacitor contacts 147 are formed in the openings 144, a dielectric layer 151 is formed over the dielectric layer 141, and openings 154 are formed penetrating through the dielectric layer 151 to expose the capacitor contacts 147, as shown in FIGS. 20 and 21 in accordance with some embodiments. The respective step is illustrated as the step S27 in the method 10 shown in FIG. 3. In some embodiments, the capacitor contacts 147 electrically connect the source/drain regions 113b to the subsequently formed capacitors 167 (see FIGS. 1 and 2).

In some embodiments, the capacitor contacts 147 include a conductive material, such as copper (Cu), tungsten (W), aluminum (Al), titanium (Ti), tantalum (Ta), gold (Au), silver (Ag), or a combination thereof. The capacitor contacts 147 may be formed by a deposition process and a subsequent planarization process. The deposition process may include a CVD process, a PVD process, a sputtering process, a plating process, or another suitable process. The planarization process may be a CMP process. Some materials and processes used to form the dielectric layer 151 are similar to, or the same as those used to form the dielectric layer 141, and details thereof are not repeated herein.

After the dielectric layer 151 is formed, the openings 154 are formed penetrating through the dielectric layer 151 to expose the capacitor contacts 147, in accordance with some embodiments. The formation of the openings 154 may include forming a patterned mask (not shown) over the dielectric layer 151, and etching the dielectric layer 151 by using the patterned mask as a mask to expose the capacitor contacts 147. The etching process may be a wet etching process, a dry etching process, or a combination thereof. After the openings 154 are formed, the pattered mask may be removed.

Subsequently, capacitors 167 are formed in the openings 154 in the dielectric layer 151, as shown in FIGS. 1 and 2 in accordance with some embodiments. The respective step is illustrated as the step S29 in the method 10 shown in FIG. 3. In some embodiments, the capacitors 167 are electrically connected to the source/drain regions 113b through the capacitor contacts 147. As mentioned above, each of the capacitors 167 includes a bottom electrode 161, a top electrode 165 disposed over and surrounded by the bottom electrode 161, and a capacitor dielectric layer 163 disposed between and in direct contact with the bottom electrode 161 and the top electrode 165.

The formation of the capacitors 167 may include sequentially depositing a conductive material, a dielectric material and another conductive material in the openings 154 (see FIGS. 20 and 21) and extending over the dielectric layer 151, and performing a planarization process (e.g., a CMP process) to remove excess portions of the two conductive materials and the dielectric material. In some embodiments, the bottom electrodes 161 include titanium nitride (TiN), the capacitor dielectric layers 163 include a dielectric material, such as silicon dioxide (SiO₂), hafnium dioxide (HfO₂), aluminum oxide (Al₂O₃), zirconium dioxide (ZrO₂), or a combination thereof, and the top electrodes 165 include titanium nitride (TiN), low-stress silicon-germanium (SiGe), or a combination thereof.

After the capacitors 167 are formed, the memory device 100 is obtained. In some embodiments, the memory device 100 is part of a dynamic random access memory (DRAM).

Embodiments of a memory device with a tapered bit line contact and method for preparing the same are provided in the disclosure. In some embodiments, the memory device 100 includes bit line contacts 129 having tapered profiles. In some embodiments, the bit line contacts 129 are tapered along a direction from the bit lines 135 towards the semiconductor substrate 101. Therefore, overlay or alignment failure issues may be reduced, and leakage current between source/drain regions 113a and 113b may be avoided. As a result, the overall device performance may be improved, and the yield rate of the memory device 100 may be increased.

In one embodiment of the present disclosure, a memory device is provided. The memory device includes a semiconductor substrate having an active region, and a word line extending across the active region. The memory device also includes a first source/drain region and a second source/drain region disposed in the active region and on opposite sides of the word line. The memory device further includes a bit line contact disposed over and electrically connected to the first source/drain region. The bit line contact has a tapered profile. In addition, the memory device includes a capacitor contact disposed over and electrically connected to the second source/drain region.

In another embodiment of the present disclosure, a memory device is provided. The memory device includes a semiconductor substrate having an active region, and a word line extending across the active region. The memory device also includes a first source/drain region and a second source/drain region disposed in the active region and on opposite sides of the word line. The memory device further includes a dielectric cap layer covering the word line, and a bit line contact penetrating through the dielectric cap layer to contact the first source/drain region. A top width of the bit line contact is greater than a bottom width of the bit line contact. In addition, the memory device includes a capacitor contact penetrating through the dielectric cap layer to contact the second source/drain region.

In yet another embodiment of the present disclosure, a method for preparing a memory device is provided. The method includes forming a doped region in a semiconductor substrate, and forming a word line across the doped region such that a first source/drain region and a second source/drain region are formed in the doped region and on opposite sides of the word line. The method also includes forming a dielectric cap layer covering the word line, the first source/drain region and the second source/drain region, and forming a first opening penetrating through the dielectric cap layer to expose the first source/drain region. The first opening has a tapered profile along a direction from a top surface of the dielectric cap layer towards the first source/drain region. The method further includes forming a bit line contact in the first opening, and forming a second opening penetrating through the dielectric cap layer to expose the second source/drain region. In addition, the method includes forming a capacitor contact in the second opening.

The embodiments of the present disclosure have some advantageous features. In some embodiments, the memory device includes bit line contacts having tapered profiles.

Therefore, overlay or alignment failure issues may be reduced, and leakage current between source/drain regions may be avoided. As a result, the overall device performance may be improved, and the yield rate of the memory device may be increased.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A memory device, comprising:
a semiconductor substrate having an active region;
a word line extending across the active region;
a first source/drain region and a second source/drain region disposed in the active region and on opposite sides of the word line, wherein the first source/drain region and a top surface of the second source/drain region are identical that a top surface of the first source/drain region and a top surface of the second source/drain region are coplanar with each other;
a bit line contact disposed over and electrically connected to the first source/drain region, wherein the bit line contact has a tapered profile; and
a capacitor contact disposed over and electrically connected to the second source/drain region.

2. The memory device of claim 1, further comprising:
a dielectric cap layer disposed over the semiconductor substrate to cover the first source/drain region and the second source/drain region, wherein the capacitor contact and the bit line contact penetrate through the dielectric cap layer; and
a bit line contact spacer disposed between the dielectric cap layer and the bit line contact, wherein the bit line contact spacer is extended from the first source/drain region, wherein the bit line contact is surrounded by the bit line contact spacer to separate the bit line contact from the dielectric cap layer by the bit line contact spacer.

3. The memory device of claim 2, wherein the bit line contact spacer and the dielectric cap layer include different materials.

4. The memory device of claim 2, further comprising:
a dielectric layer disposed on the dielectric cap layer, wherein the capacitor contact penetrates through the dielectric cap layer and the dielectric layer, wherein the bit line contact is positioned below the dielectric layer; and
a capacitor disposed over and electrically connected to the capacitor contact.

5. The memory device of claim 1, further comprising:
a bit line disposed over and electrically connected to the bit line contact.

6. The memory device of claim 5, wherein the bit line contact is tapered from the bit line to the semiconductor substrate.

7. The memory device of claim 5, wherein a top width of the bit line contact is the same as a bottom width of the bit line.

8. The memory device of claim 1, wherein a top width of the bit line contact is greater than a bottom width of the bit line contact, wherein the bottom width of the bit line contact is less than a top width of the first source/drain region.

9. A memory device, comprising:
a semiconductor substrate having an active region;
a word line extending across the active region;
a first source/drain region and a second source/drain region disposed in the active region and on opposite sides of the word line;
a dielectric cap layer covering the word line, the first source/drain region, and the second source/drain region;
a dielectric layer disposed on the dielectric cap layer;
a bit line contact penetrating through the dielectric cap layer to contact the first source/drain region, wherein a top width of the bit line contact is greater than a bottom width of the bit line contact; and
a capacitor contact penetrating through the dielectric cap layer and the dielectric layer to contact the second source/drain region.

10. The memory device of claim 9, wherein the bit line contact has a tapered profile along a direction from a top surface of the dielectric cap layer towards the first source/drain region.

11. The memory device of claim 9, wherein a ratio of the top width to the bottom width of the bit line contact is in a range from 1.45 to 1.85.

12. The memory device of claim 9, wherein an angle between a top surface and a sidewall of the bit line contact is in a range from about 73 degrees to about 81 degrees.

13. The memory device of claim 9, further comprising:
a bit line contact spacer surrounding the bit line contact and separating the bit line contact from the dielectric cap layer, wherein the bit line contact spacer is extended from the first source/drain region.

14. The memory device of claim 13, further comprising:
a capacitor disposed over the capacitor contact, wherein the capacitor is disposed above the dielectric layer; and
a bit line disposed over the bit line contact, wherein the bit line is disposed in and covered by the dielectric layer.

15. The memory device of claim 14, further comprising:
a bit line spacer disposed on a sidewall of the bit line, wherein the bit line spacer is in direct contact with the bit line contact spacer, wherein the bit line contact spacer is formed on a tapered sidewall of the bit line contact spacer and is covered by the dielectric layer.

* * * * *